United States Patent
Nakanishi et al.

(10) Patent No.: US 12,225,313 B2
(45) Date of Patent: Feb. 11, 2025

(54) IMAGE CAPTURING DEVICE AND IMAGE CAPTURING APPARATUS

(71) Applicant: NIKON CORPORATION, Tokyo (JP)

(72) Inventors: Sota Nakanishi, Kawasaki (JP); Shigeru Matsumoto, Sagamihara (JP); Tomoki Hirata, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 73 days.

(21) Appl. No.: 17/800,433

(22) PCT Filed: Feb. 17, 2021

(86) PCT No.: PCT/JP2021/006011
§ 371 (c)(1),
(2) Date: Aug. 17, 2022

(87) PCT Pub. No.: WO2021/166979
PCT Pub. Date: Aug. 26, 2021

(65) Prior Publication Data
US 2023/0126104 A1    Apr. 27, 2023

(30) Foreign Application Priority Data

Feb. 17, 2020 (JP) ................................. 2020-024780
Feb. 17, 2020 (JP) ................................. 2020-024781

(51) Int. Cl.
*H04N 25/771* (2023.01)
*H01L 27/146* (2006.01)
(Continued)

(52) U.S. Cl.
CPC ..... *H04N 25/771* (2023.01); *H01L 27/14634* (2013.01); *H04N 25/50* (2023.01); *H04N 25/766* (2023.01)

(58) Field of Classification Search
None
See application file for complete search history.

(56) References Cited

U.S. PATENT DOCUMENTS 7,128,270 B2 * 10/2006 Silverbrook ....... H04N 1/00968
                                                       235/462.46
8,767,107 B2 *  7/2014 Teshima ................. H04N 25/63
                                                          348/300

(Continued)

FOREIGN PATENT DOCUMENTS

EP         3468169 A1    4/2019
JP     2013-051674 A    3/2013
(Continued)

OTHER PUBLICATIONS

Sep. 12, 2023 Office Action issued in Japanese Patent Application No. 2022-501950.
(Continued)

*Primary Examiner* — James M Hannett
(74) *Attorney, Agent, or Firm* — Oliff PLC

(57) ABSTRACT

An image capturing device including a pixel chip having pixel blocks each including one or more pixels; and a signal processing chip having a first control block including a first converting unit for converting a signal from a pixel in at least a first pixel block into a digital signal, and a first storage unit storing the digital signal, and a second control block next to the first control block in a column direction and including a second converting unit for converting a signal from a pixel included in at least a second pixel block into a digital signal, and a second storage unit storing the digital signal, wherein the second converting unit and the second storage unit in the second control block are reversed vertically to the first converting unit and the first storage unit in the first control block.

54 Claims, 27 Drawing Sheets

(51) Int. Cl.
*H04N 25/50* (2023.01)
*H04N 25/766* (2023.01)

(56) References Cited

U.S. PATENT DOCUMENTS

| | | | |
|---|---|---|---|
| 10,291,829 B2* | 5/2019 | Mabuchi | H04N 25/75 |
| 10,412,327 B2* | 9/2019 | Takahashi | H04N 25/772 |
| 11,165,976 B2* | 11/2021 | Kobayashi | H04N 25/767 |
| 11,867,842 B2* | 1/2024 | Yasu | G01S 17/89 |
| 2009/0295422 A1* | 12/2009 | Hamer | G09G 3/3233 |
| | | | 324/760.02 |
| 2013/0033632 A1 | 2/2013 | Kishi | |
| 2014/0284453 A1 | 9/2014 | Shimizu | |
| 2015/0237247 A1 | 8/2015 | Hara | |
| 2016/0118424 A1* | 4/2016 | Guidash | H01L 27/14636 |
| | | | 257/231 |
| 2018/0227514 A1 | 8/2018 | Takahashi | |
| 2019/0124287 A1 | 4/2019 | Takamiya et al. | |
| 2019/0229138 A1 | 7/2019 | Lee et al. | |
| 2021/0029321 A1* | 1/2021 | Ma | H01L 27/14641 |

FOREIGN PATENT DOCUMENTS

| | | |
|---|---|---|
| JP | 2015-154413 A | 8/2015 |
| JP | 2017-192056 A | 10/2017 |
| KR | 10-2018-0033162 A | 4/2018 |
| WO | 2013/088634 A1 | 6/2013 |
| WO | 2017/018188 A1 | 2/2017 |
| WO | 2017/209221 A1 | 12/2017 |

OTHER PUBLICATIONS

Apr. 13, 2021 International Search Report issued in International Patent Application No. PCT/JP2021/006011.
Aug. 23, 2022 International Preliminary Report on Patentability issued in International Patent Application No. PCT/JP2021/006011.
Mar. 14, 2024 Office Action issued in Korean Patent Application No. 10-2022-7028294.
Dec. 19, 2023 Search Report issued in European Patent Application No. 21756949.0.
Nov. 29, 2024 Office Action issued in Chinese Patent Application No. 202180014844.X.

* cited by examiner

IMAGE CAPTURING DEVICE AND IMAGE CAPTURING APPARATUS

BACKGROUND

1. Technical Field

The present invention relates to an image capturing device and an image capturing apparatus.

2. Related Art

Known is an image capturing apparatus configured to perform image capturing with an exposure time that is different for each pixel block having a plurality of pixels (for example, Patent Document 1).
Patent Document 1: WO2017/018188
In the image capturing apparatus of the related art, it is needed to improve layout efficiency.

GENERAL DISCLOSURE

A first aspect of the present invention provides an image capturing device including a pixel chip having a plurality of pixel blocks each including one or more pixels; and a signal processing chip having a first control block including a first converting unit configured to convert a signal from a pixel included in at least a first pixel block among the plurality of pixel blocks into a digital signal, and a first storage unit configured to store the digital signal converted in the first converting unit, and a second control block arranged next to the first control block in a column direction and including a second converting unit configured to convert a signal from a pixel included in at least a second pixel block among the plurality of pixel blocks into a digital signal, and a second storage unit configured to store the digital signal converted in the second converting unit, wherein the second converting unit and the second storage unit in the second control block are arranged at positions reversed vertically with respect to arrangement positions of the first converting unit and the first storage unit in the first control block.

A second aspect of the present invention provides an image capturing apparatus including the image capturing device of the first aspect.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments are essential to the solution of the invention.

In the present specification, the X-axis and the Y-axis are orthogonal to each other, and the Z-axis is orthogonal to the XY plane. The XYZ axes constitute a right-handed system. A direction parallel to the Z-axis may be referred to as a stacking direction of the image capturing device 400. As used herein, the terms "upper" and "lower" are not limited to the upper and lower direction in the direction of gravity. These terms just refer to relative directions in the Z-axis direction. Note that, in the present specification, the alignment in the X-axis direction is described as a "row" and the alignment in the Y-axis direction is described as a "column", but the row direction and the column direction are not limited thereto.

Figure 1A:
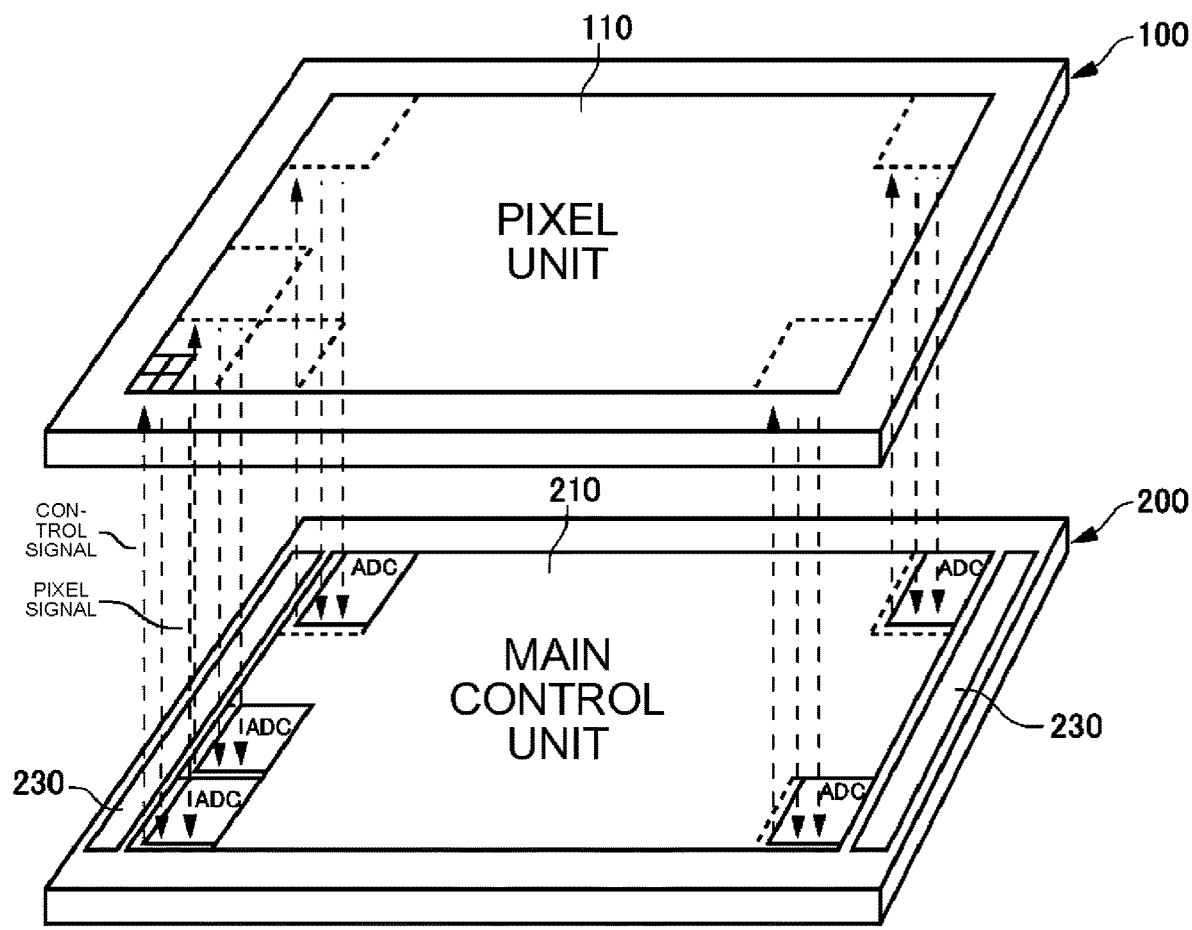
FIG. 1A shows an outline of an image capturing device 400 according to an embodiment of the present invention.

FIG. 1A shows an outline of an image capturing device 400 according to the present embodiment. The image capturing device 400 is configured to capture a photographic subject. The image capturing device 400 is configured to generate image data of the captured photographic subject. The image capturing device 400 includes a pixel chip 100 and a signal processing chip 200. As shown in FIG. 1A, the pixel chip 100 is stacked on the signal processing chip 200.

The pixel chip 100 has a pixel unit 110. The pixel unit 110 is configured to output a pixel signal based on incident light.

The signal processing chip 200 has a main circuit unit 210 and a peripheral circuit unit 230.

A pixel signal output from the pixel chip 100 is input to the main circuit unit 210. The main circuit unit 210 is configured to process the input pixel signal. The main circuit unit 210 of the present example is arranged at a position on the signal processing chip 200, which faces the pixel unit 110. The main circuit unit 210 may be configured to output a control signal for controlling drive of the pixel unit 110 to the pixel unit 110.

The peripheral circuit unit 230 is configured to control drive of the main circuit unit 210. The peripheral circuit unit 230 is arranged at the periphery of the main circuit unit 210 on the signal processing chip 200. In addition, the peripheral circuit unit 230 may be electrically connected to the pixel chip 100 to control drive of the pixel unit 110. The peripheral circuit unit 230 of the present example is arranged along two sides of the signal processing chip 200. However, the arrangement method of the peripheral circuit unit 230 is not limited to the present example.

Note that, the image capturing device 400 may have a memory chip stacked on the signal processing chip 200, in addition to the pixel chip 100 and the signal processing chip 200. For example, the memory chip is configured to perform image processing corresponding to a signal output by the signal processing chip 200. Further, a structure of the image capturing device 400 may be of a back side illumination type or a front side illumination type.

Figure 1B:
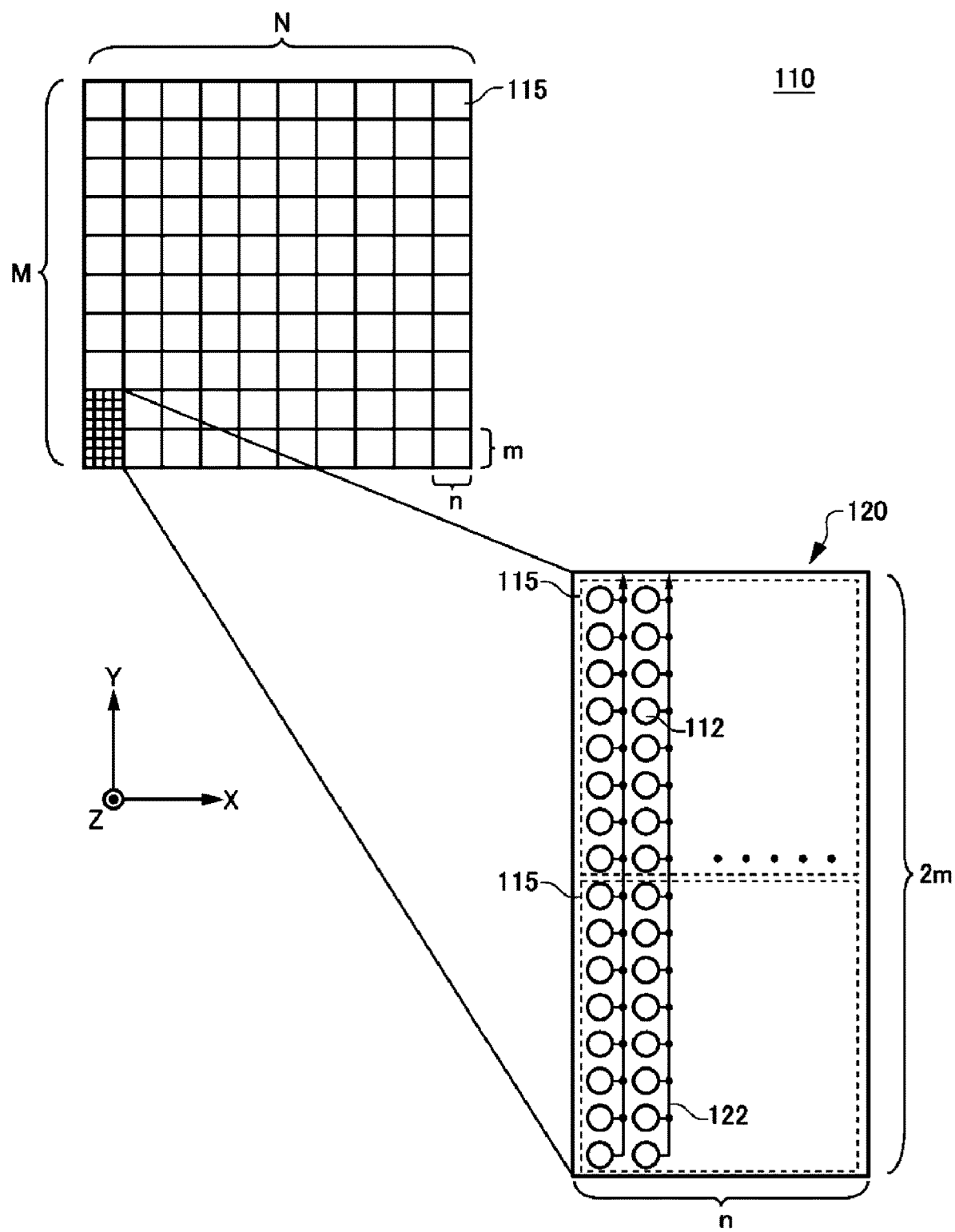
FIG. 1B shows an example of a specific configuration of a pixel unit 110.

FIG. 1B shows an example of a specific configuration of the pixel unit 110. In the present example, the pixel unit 110 and an enlarged view of a pixel block 120 provided to the pixel unit 110 are shown.

The pixel unit 110 has a plurality of pixel groups 115 arranged side by side along the row direction and the column direction. The pixel unit 110 of the present example has M×N pixel groups 115 (M and N are natural numbers). The present example shows a case where M is equal to N, but M and N may be different.

The pixel group 115 has at least one pixel 112. The pixel group 115 of the present example has m×n pixels 112 (m and n are natural numbers). For example, the pixel group 115 has 16×16 pixels 112. The number of the pixels 112 corresponding to the pixel group 115 is not limited thereto. The present example shows a case where m is equal to n, but m and n may be different. The pixel group 115 has a plurality of pixels 112 connected to a common control line in the row direction. For example, each pixel 112 of the pixel group 115 is connected to the common control line so as to be set to the same exposure time. In an example, n pixels 112 aligned in the row direction are connected by the common control line.

On the other hand, the pixel groups 115 may be set to different exposure times, respectively. That is, each pixel 112 of the pixel group 115 has the same exposure time, but other pixel groups 115 may be set to different exposure times. For example, when the pixels 112 of the pixel group 115 are connected by the common control line in the row direction, the pixels 112 of the other pixel groups 115 are commonly connected by different control lines.

A pixel block 120 has one or more pixel groups 115. The pixel block 120 of the present example has two pixel groups 115 arranged side by side along the column direction. The pixel block 120 is arranged corresponding to a control block 220, which will be described later. That is, two pixel groups 115 are arranged for one control block 220. When the pixel block 120 has a plurality of pixel groups 115, the respective pixel groups 115 may be set to different exposure times. When the pixel block 120 has one pixel group 115, one pixel group 115 is arranged for the control block 220. The pixel block 120 has 2 m×n pixels 112. For example, the pixel block 120 has 32×16 pixels 112. The number of the pixels 112 corresponding to the pixel block 120 is not limited thereto.

The pixel 112 has a photoelectric converting function of converting light into electric charges. The pixel 112 is configured to accumulate the photoelectrically converted electric charges. The 2m pixels 112 are arranged along the column direction and connected to a common signal line 122. The 2m pixels 112 are aligned side by side in n columns in the row direction in the pixel block 120.

Figure 1C:
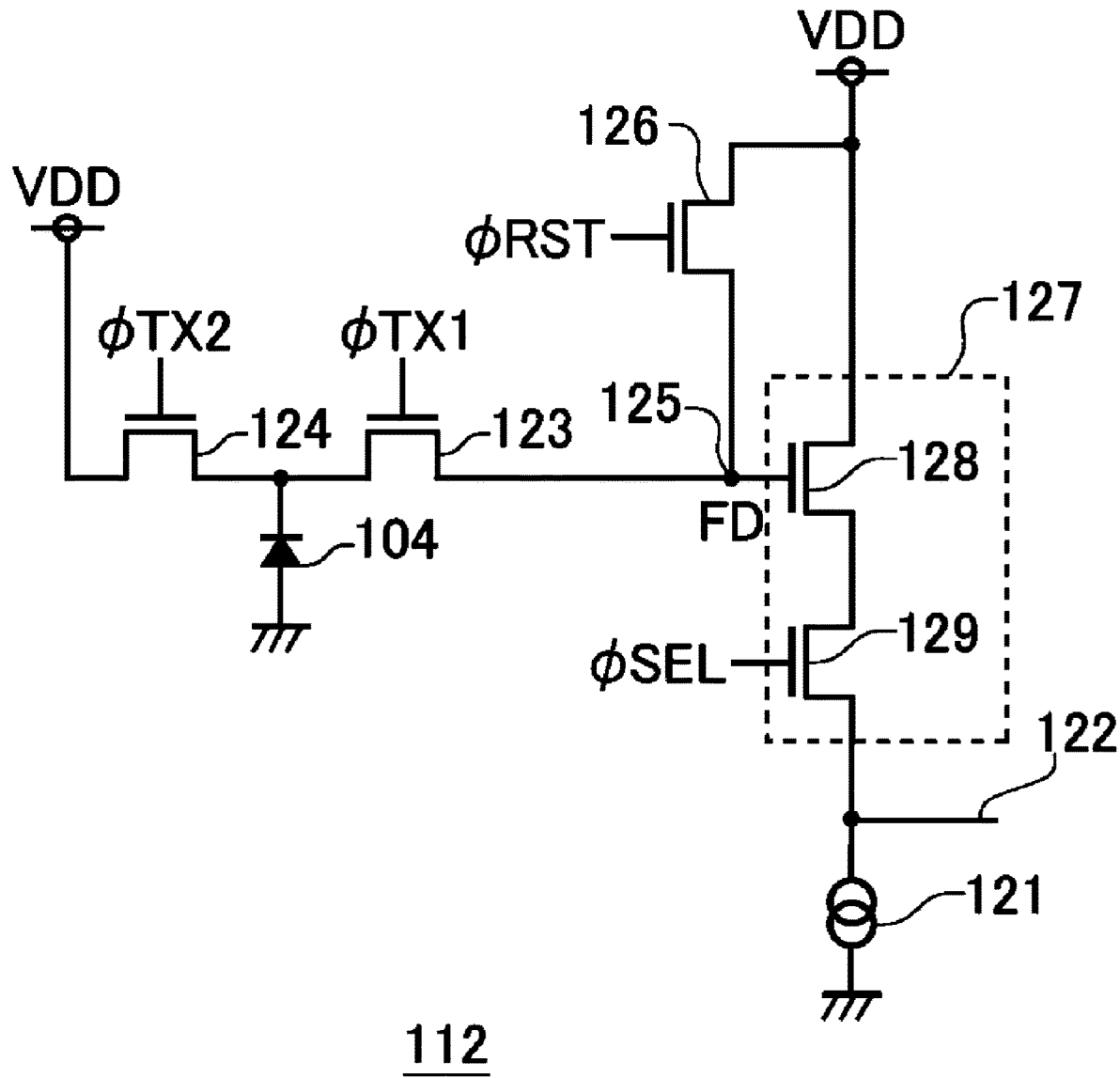
FIG. 1C shows an example of a circuit configuration of a pixel 112.

FIG. 1C shows an example of a circuit configuration of the pixel 112. The pixel 112 has a photoelectric converting unit 104, a first transfer unit 123, a second transfer unit 124, a reset unit 126 and a pixel output unit 127. The pixel output unit 127 has an amplifying unit 128 and a selecting unit 129. In the present example, the first transfer unit 123, the second transfer unit 124, the reset unit 126, the amplifying unit 128 and the selecting unit 129 are described as N-channel FETs, but the type of transistor is not limited thereto.

The photoelectric converting unit 104 has a photoelectric converting function of converting light into electric charges. The photoelectric converting unit 104 is configured to accumulate the photoelectrically converted electric charges. The photoelectric converting unit 104 is, for example, a photo diode.

The first transfer unit 123 is configured to transfer the electric charges accumulated in the photoelectric converting unit 104 to an accumulating unit 125. The first transfer unit 123 is an example of a transfer gate configured to transfer electric charges of the photoelectric converting unit 104. A gate terminal of the first transfer unit 123 is connected to a local control line for inputting a first transfer control signal φTX1. The local control line will be described later.

The second transfer unit 124 is configured to discharge the electric charges accumulated in the photoelectric converting unit 104 to a power supply wiring to which a power supply voltage VDD is supplied. A gate terminal of the second transfer unit 124 is connected to a local control line for inputting a second transfer control signal φTX2. Note that, in the present example, the second transfer unit 124 is described as discharging the electric charges of the photoelectric converting unit 104 to the power supply wiring to which the power supply voltage VDD is supplied, but may be configured to discharge the electric charges to a power supply wiring to which a power supply voltage different from the power supply voltage VDD is supplied.

The electric charges from the photoelectric converting unit 104 are transferred to the accumulating unit 125 by the first transfer unit 123. The accumulating unit 125 is an example of a floating diffusion (FD).

The reset unit 126 is configured to discharge the electric charges of the accumulating unit 125 to the power supply wiring to which the predetermined power supply voltage VDD is supplied. A gate terminal of the reset unit 126 is connected to a global control line 143 for inputting a reset control signal φRST. The global control line 143 will be described later.

The pixel output unit 127 is configured to output a signal based on a potential of the accumulating unit 125 to the signal line 122. The pixel output unit 127 has the amplifying unit 128 and the selecting unit 129. The amplifying unit 128 has a gate terminal connected to the accumulating unit 125, a drain terminal connected to the power supply wiring to which the power supply voltage VDD is supplied, and a source terminal connected to a drain terminal of the selecting unit 129.

The selecting unit 129 is configured to control electrical connection between the pixel 112 and the signal line 122. When the pixel 112 and the signal line 122 are electrically connected by the selecting unit 129, a pixel signal is output from the pixel 112 to the signal line 122. A gate terminal of the selecting unit 129 is connected to the global control line 143 for inputting a selection control signal φSEL. A source terminal of the selecting unit 129 is connected to a load current source 121.

The load current source 121 is configured to supply current to the signal line 122. The load current source 121 may be provided to the pixel chip 100 or the signal processing chip 200.

Figure 1D:
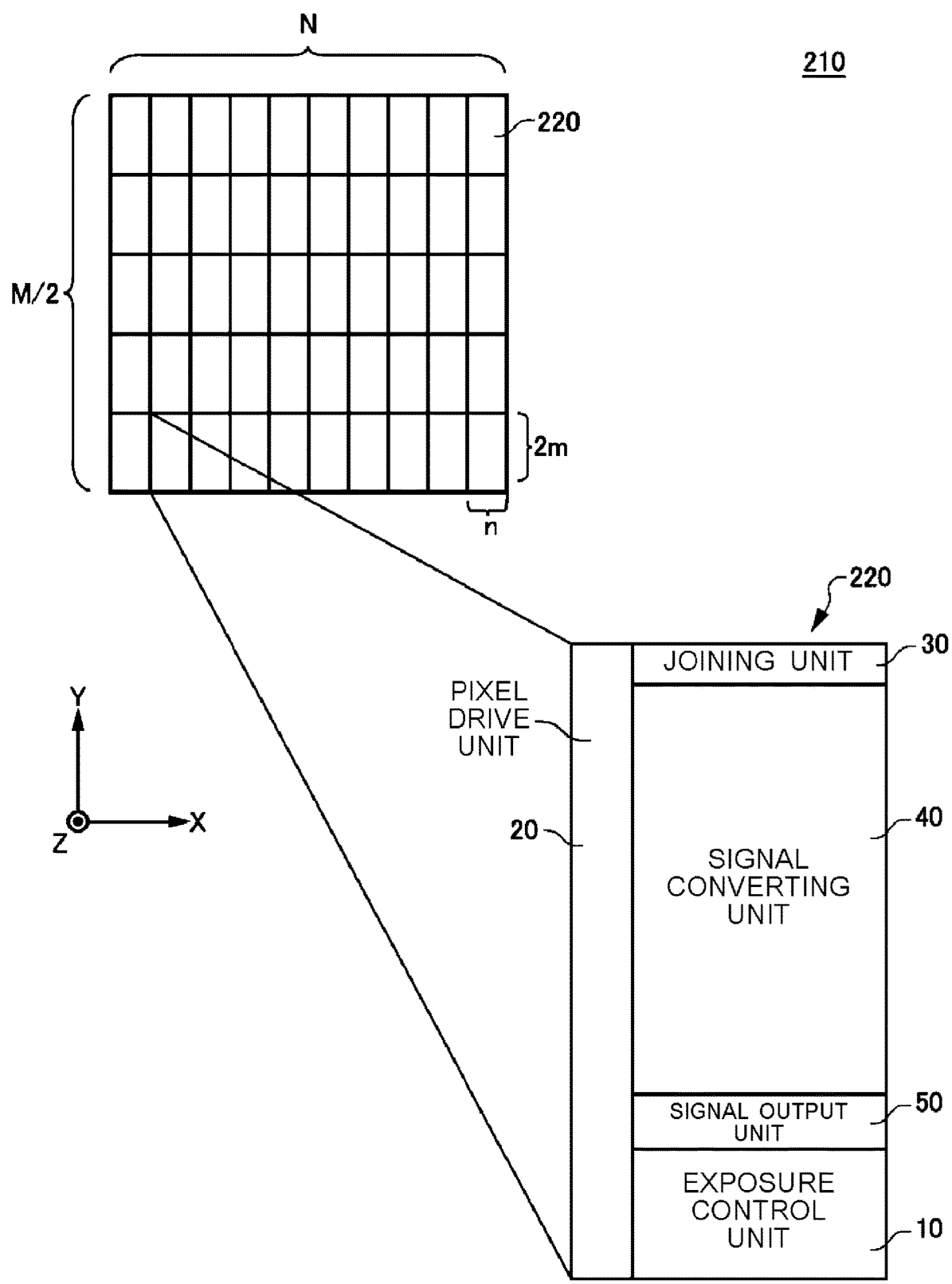
FIG. 1D shows an example of a more specific configuration of a main circuit unit 210.

FIG. 1D shows an example of a more specific configuration of the main circuit unit 210. In the present example, the main circuit unit 210 and an enlarged view of a control block 220 provided to the main circuit unit 210 are shown.

The main circuit unit 210 has control blocks 220 arranged along the row direction and the column direction. The main circuit unit 210 of the present example has (M/2)×N control blocks 220. In the present example, the main circuit unit 210 has one control block 220 for two pixel groups 115 arranged side by side along the column direction.

The control blocks 220 are arranged at positions corresponding to the pixel blocks 120, respectively. The control block 220 is configured to control drive of the corresponding pixel block 120. For example, the control block 220 is configured to control an exposure time of the pixel block 120. The control block 220 may be configured to control the exposure time for each pixel group 115. In addition, the control block 220 has a processing circuit such as an AD converter, and is configured to process a signal output by the pixel block 120. In an example, the control block 220 is configured to convert an analog pixel signal output from the corresponding pixel block 120 into a digital signal. The control block 220 of the present example includes an exposure control unit 10, a pixel drive unit 20, a joining unit 30, a signal converting unit 40 and a signal output unit 50.

The exposure control unit 10 is configured to control exposures of the plurality of pixels 112. The exposure control unit 10 is configured to generate a signal for controlling an exposure time of the pixel 112. In an example, the exposure control unit 10 is configured to control the exposure time for each pixel group 115 by adjusting at least one of a start timing or an end timing of exposure. The exposure control unit 10 of the present example is provided extending in the row direction.

The pixel drive unit 20 is joined to the pixel chip 100 and is configured to drive the plurality of pixels 112. The pixel drive unit 20 is configured to select and drive an arbitrary pixel 112 from the plurality of pixels 112. The pixel drive unit 20 of the present example is provided extending in the column direction. Thereby, the pixel drive unit 20 is arranged at a position corresponding to the 2m pixels 112 arranged in the column direction. As the pixel drive unit 20 extends in the column direction and the exposure control unit 10 extends in the row direction, the exposure control unit 10 and the pixel drive unit 20 are arranged in an L-shape.

The joining unit 30 is configured to join the pixel chip 100 and the signal processing chip 200 each other. The joining unit 30 is configured to input a pixel signal input from the pixel chip 100 to the signal converting unit 40. The joining unit 30 is provided corresponding to the n pixels 112 arranged in the row direction, and is configured to input a pixel signal to the signal converting unit 40 for each column.

The signal converting unit 40 is configured to digitally convert an analog signal output by the pixel unit 110. The signal converting unit 40 of the present example is configured to convert an analog pixel signal into a digital signal. The signal converting unit 40 is configured to digitally convert sequentially analog signals from the 2m pixels 112 aligned in the column direction. The signal converting unit 40 is configured to digitally convert, in parallel, analog signals from the pixels 112 aligned in n columns in the row direction.

The signal output unit 50 is configured to receive the digital signal from the signal converting unit 40. In an example, the signal output unit 50 is configured to temporarily store the digital signal. The signal output unit 50 may have a latch circuit for storing a digital signal. The signal output unit 50 is provided between the signal converting unit 40 and the exposure control unit 10 in the column direction, and is configured to output a digital signal. The signal output unit 50 of the present example is configured to output a digital signal to an outside of the main circuit unit 210. The signal output unit 50 extends in the row direction and is provided adjacent to the signal converting unit 40 and the exposure control unit 10.

The image capturing device 400 of the present example has a function of reading pixel signals in parallel by the control block 220 provided for each pixel block 120. Since the image capturing device 400 can set an exposure time for each pixel group 115 according to the intensity of incident light, a dynamic range can be expanded.

Figure 2A:
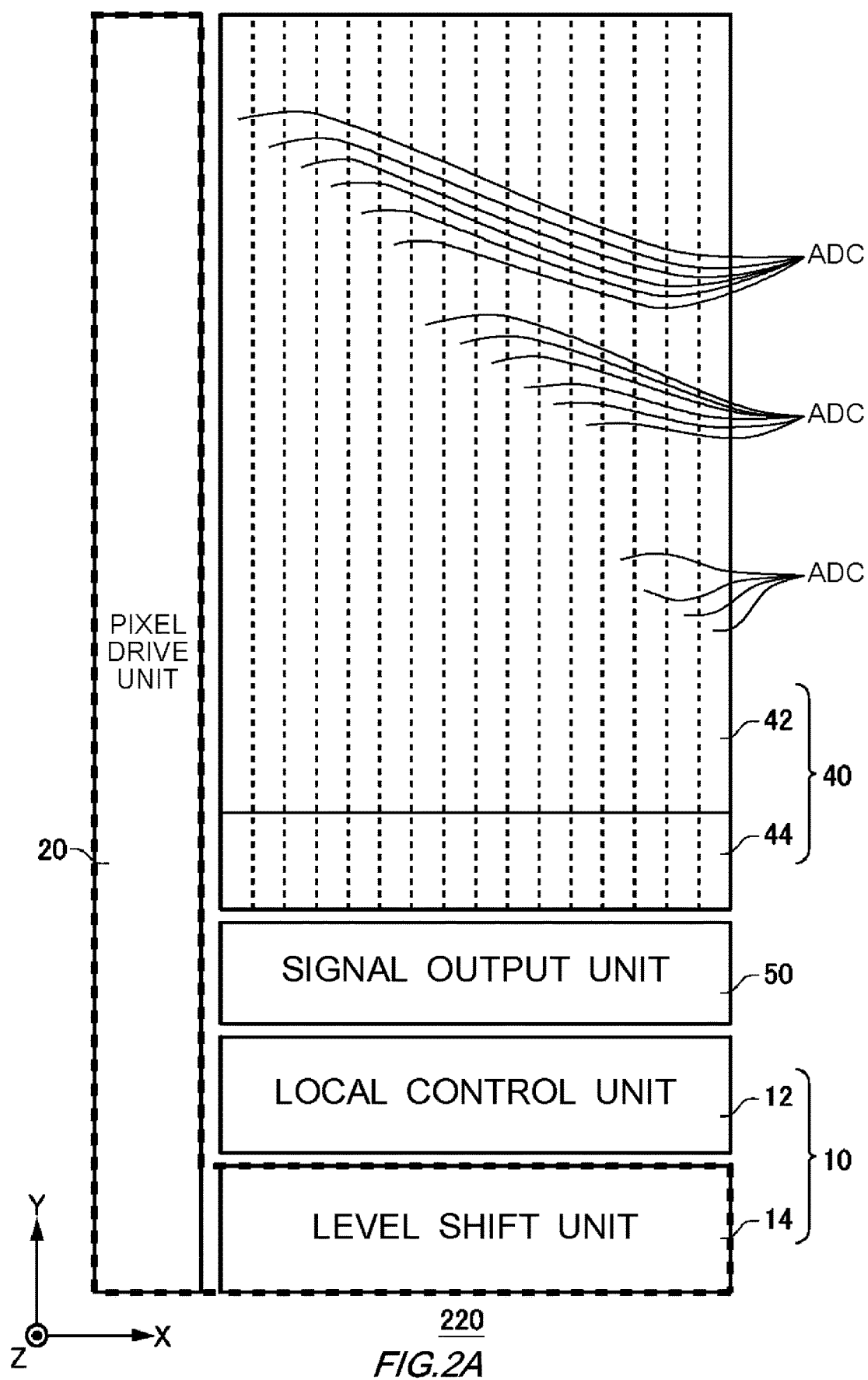
FIG. 2A shows an example of a specific configuration of a control block 220.

FIG. 2A shows an example of a specific configuration of the control block 220. The signal converting unit 40 of the present example includes n comparators 42 and a storage unit 44. The control block 220 of the present example includes a local control unit 12 and a level shift unit 14 constituting the exposure control unit 10.

The comparator 42 is provided extending in the column direction. The n comparators 42 are arranged in the row direction. One comparator 42 is provided for 2m pixels 112. The comparator 42 is configured to sequentially read pixel signals of the 2m pixels 112 and to convert the pixel signals into digital signals.

The storage unit 44 is configured to temporarily store the digital signal from the comparator 42. The storage unit 44 of the present example is provided on a negative side in the Y-axis direction with respect to the comparator 42, in the signal converting unit 40. For example, the storage unit 44 has a latch circuit. The storage unit 44 may have a memory constituted by an SRAM or the like.

The local control unit 12 is configured to output control signals for controlling operations of the first transfer unit 123 and the second transfer unit 124. The local control unit 12 is configured to locally control either the first transfer control signal φTX1 or the second transfer control signal φTX2. In the present specification, the local control refers to controlling drive for each pixel block 120. For example, the local control unit 12 performs local control by the second transfer control signal φTX2. The local control unit 12 is provided extending in the row direction. The local control unit 12 is provided between the level shift unit 14 and the signal output unit 50.

The level shift unit 14 is configured to convert and output a voltage level of the control signal output by the local control unit 12. The level shift unit 14 is provided extending in the row direction. The level shift unit 14 is provided on an outer periphery side of the control block 220 with respect to the local control unit 12. An end on a positive side in the X-axis direction and an end on a negative end in the Y-axis direction of the level shift unit 14 are positioned on the outermost side of the control block 220. An end on a negative side in the X-axis direction of the level shift unit 14 is in contact with the pixel drive unit 20.

The level shift unit 14 and the pixel drive unit 20 are configured to handle signals after level shift. On the other hand, the local control unit 12, the level shift unit 14 and the pixel drive unit 20 are configured to handle pixel signals output from the pixel chip 100.

Here, each configuration of the control block 220 is formed in a well region provided in a semiconductor substrate. The well regions are provided isolated according to signals to be handled. The well regions are isolated depending on whether a power supply used is a digital power supply or an analog power supply. In addition, even when the same analog power supply is used, the signal converting unit 40 may be isolated from a region in which another analog power supply is used from a standpoint of noise. Isolation of the well region requires a well isolation region with a gap corresponding to manufacturing process rules.

The control block 220 of the present example is configured to isolate well regions for forming the level shift unit 14 and the pixel drive unit 20 from other well regions. For example, the level shift unit 14 and the pixel drive unit 20 are provided in an L-shape, so that the well regions of the level shift unit 14 and the pixel drive unit 20 can be shared. By sharing the well regions, the well isolation region can be omitted, so that layout efficiency is improved.

The L-shaped exposure control unit 10 and pixel drive unit 20 form an outer periphery of the control block 220. This allows the well regions to be shared with other control blocks 220 adjacent in the row direction and the column direction.

Figure 2B:
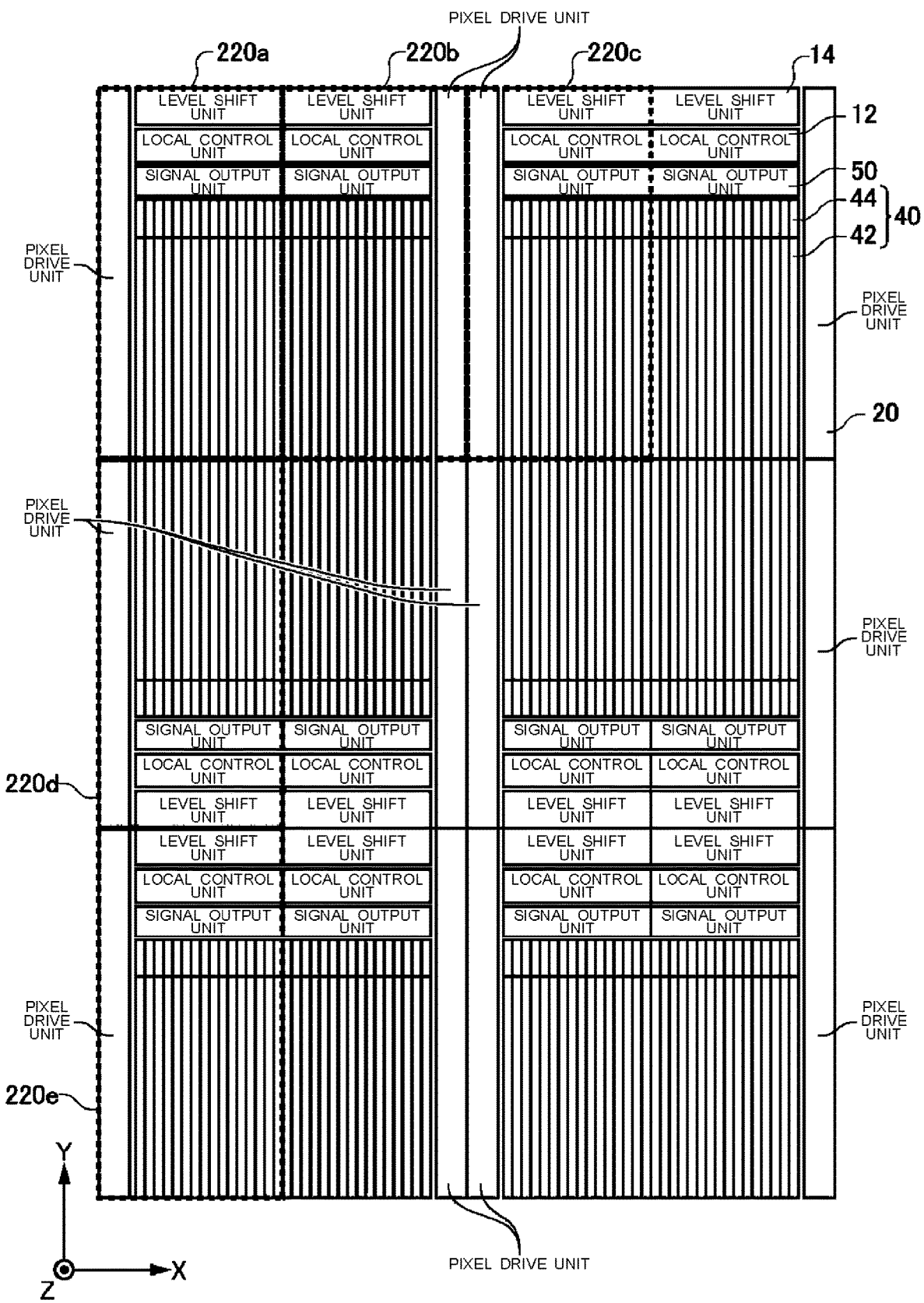
FIG. 2B shows an example of a plurality of control blocks 220 according to the embodiment.

FIG. 2B shows an example of a plurality of control blocks 220 according to the embodiment. The adjacent control blocks among the plurality of control blocks 220 of the present example are reversedly arranged. FIG. 2B illustrates twelve control blocks 220 among the plurality of control blocks 220 provided to the main circuit unit 210.

The reverse arrangement indicates that regions, in which the respective configurations (for example, the exposure control unit 10, the pixel drive unit 20, the joining unit 30, the signal converting unit 40 and the signal output unit 50) of the control blocks 220 are formed, are arranged in a mirror reverse manner about a boundary layer between blocks. That is, even the circuits of each configuration of the control block 220 may not be reversedly arranged. In addition, the reading order of each pixel of the control block 220 is not also limited to reading in reverse order.

For example, when the control blocks 220 adjacent in the row direction are reversedly arranged, each configuration of the control blocks 220 is reversedly arranged in the row direction. Therefore, the same configuration is adjacently arranged at a boundary of the blocks. Similarly, when the control blocks 220 adjacent in the column direction are reversedly arranged, each configuration of the control blocks 220 is reversedly arranged in the column direction. Therefore, the same configuration is adjacently arranged at a boundary of the blocks. Thereby, the layout efficiency of the control block 220 can be improved.

The control blocks 220 are reversedly arranged with respect to the adjacent control blocks 220, respectively. In the present example, all the control blocks 220 are reversedly arranged in the row direction and the column direction, but may also be reversedly arranged in either the row direction or the column direction. For example, the comparators 42 of the control block 220 are reversedly arranged with respect to the comparators 42 of the control block 220 adjacent in the row direction. In addition, the comparators 42 of the control block 220 are also reversedly arranged with respect to the comparators 42 of the control block 220 adjacent in the column direction. Similarly, the storage unit 44 of the control block 220 is reversedly arranged with respect to the storage units 44 of the control blocks 220 adjacent in the row direction and the column direction, respectively.

A control block 220a and a control block 220b are provided adjacent in the row direction. The control block 220a is reversedly arranged with respect to the control block 220b. The level shift unit 14 of the control block 220a is provided in the same well region as the level shift unit 14 of the control block 220b. Similarly, the local control unit 12, the storage unit 44 and the signal output unit 50 are provided in the same well regions in the control block 220a and the control block 220b.

The control block 220b and a control block 220c are provided adjacent in the row direction. The control block 220b is reversedly arranged with respect to the control block 220c. The pixel drive unit 20 of the control block 220b is provided in the same well region as the pixel drive unit 20 of the control block 220c. The well region of the pixel drive unit 20 may also be shared with the well region of the level shift unit 14.

The control block 220a and a control block 220d are provided adjacent in the column direction. The control block 220a is reversedly arranged with respect to the control block 220d. The pixel drive unit 20 of the control block 220a is provided in the same well region as the pixel drive unit 20 of the control block 220d. In addition, the signal converting unit 40 of the control block 220a is provided in the same well region as the signal converting unit 40 of the control block 220d.

The control block 220d and a control block 220e are provided adjacent in the column direction. The control block 220d is reversedly arranged with respect to the control block 220e. The pixel drive unit 20 and the level shift unit 14 of the control block 220d are provided in the same well regions as the pixel drive unit 20 and the level shift unit 14 of the control block 220e.

By reversedly arranging the control blocks 220, the image capturing device 400 of the present example can streamline a layout even when signal processing is performed in parallel for each control block 220. In the image capturing device 400, the adjacent control blocks 220 can share a well region by reversedly arranging the plurality of control blocks 220 on the XY plane. This reduces the number of switching times of the well regions and improves area efficiency.

Figure 3:
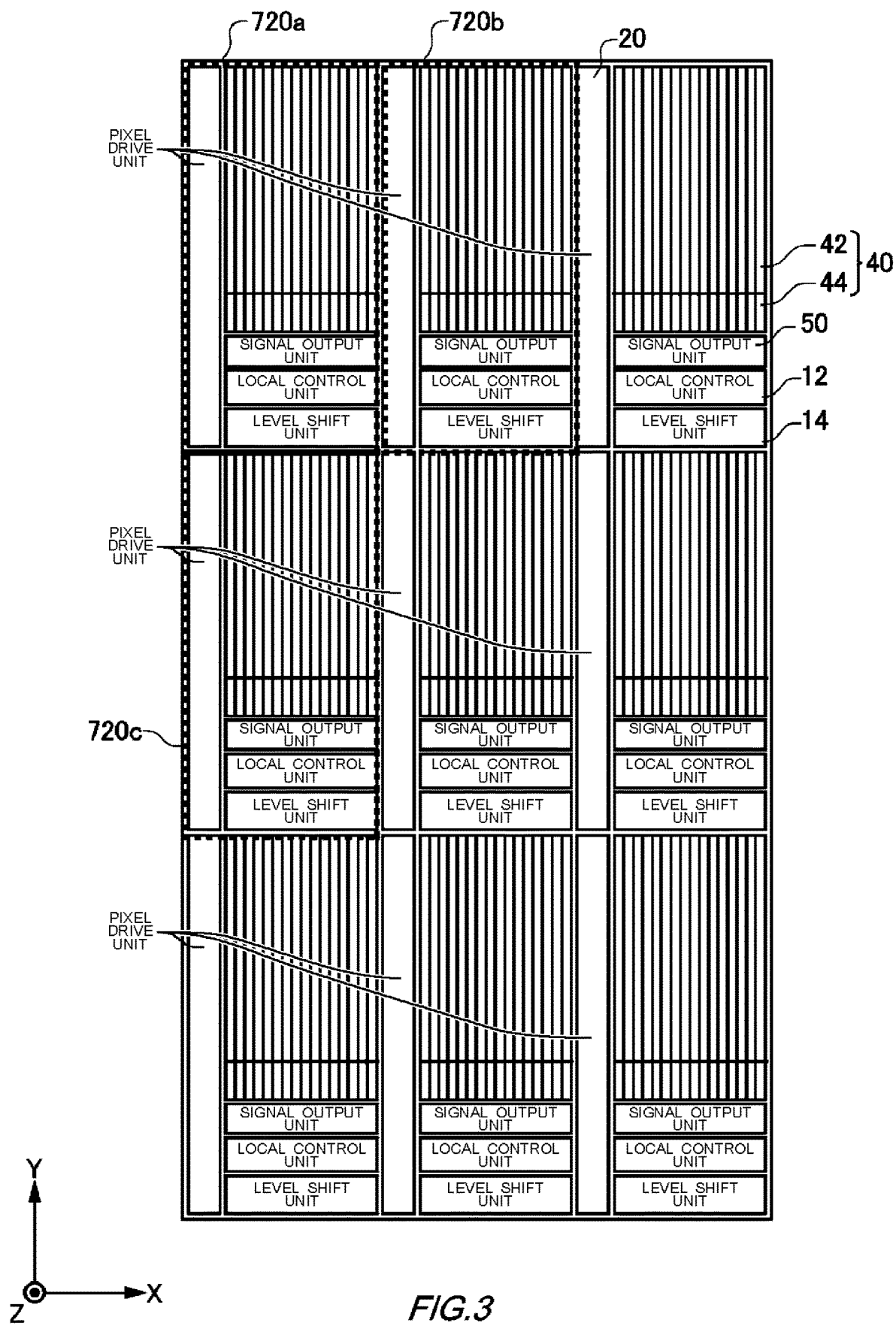
FIG. 3 shows an example of an arrangement method of control blocks 720 according to Comparative Example.

FIG. 3 shows an example of an arrangement method of control blocks 720 according to Comparative Example. The control blocks 720 of the present example are not reversedly arranged with respect to the adjacent control blocks 720. The control blocks 720 of the present example are arranged in parallel displacement on the XY plane.

A control block 720a and a control block 720b are provided adjacent in the row direction. The control block 720a is not reversedly arranged with respect to the control block 720b. For this reason, the signal converting unit 40, the signal output unit 50 and the local control unit 12 of the control block 720a need to be provided in well regions different from that of the pixel drive unit 20 of the control block 720b. Therefore, a well isolation region is provided between the control block 720a and the control block 720b.

The control block 720a and a control block 720c are provided adjacent in the Y-axis direction. The control block 720a is not reversedly arranged with respect to the control block 720c. For this reason, the level shift unit 14 of the control block 720a needs to be provided in a well region different from that of the signal converting unit 40 of the control block 720c.

Since the control blocks 720 of the present example are not reversedly arranged in this way, it is necessary to provide a well isolation region at an adjacent place on the XY plane. When a well isolation region is provided between the control blocks 720, a layout size becomes larger, as compared to the reverse arrangement as shown in FIG. 2B.

Figure 4:
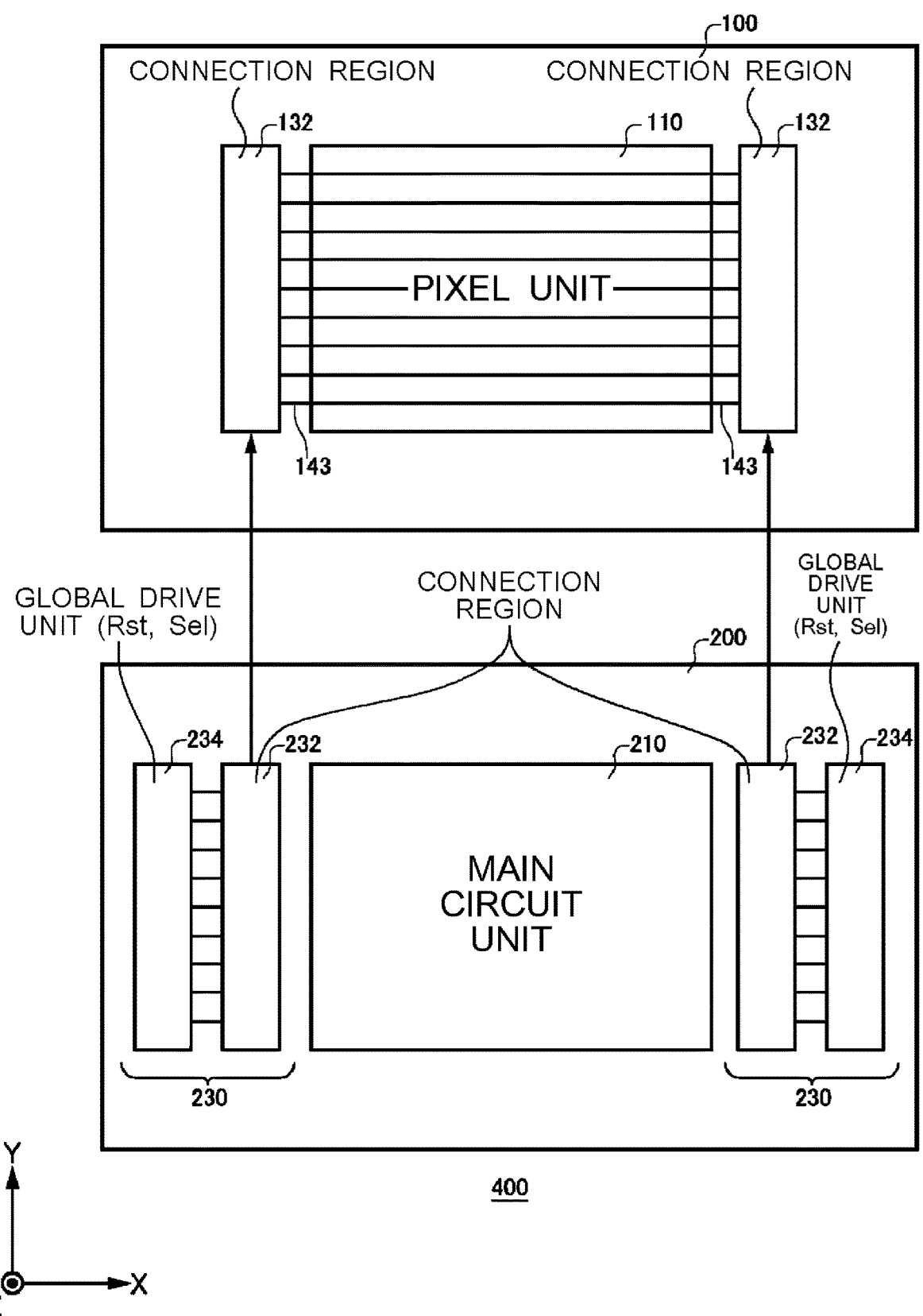
FIG. 4 shows an example of a configuration of the image capturing device 400.

FIG. 4 shows an example of a configuration of the image capturing device 400. In the present example, an example of the wiring method of the image capturing device 400 functioning as a block parallel ADC is shown.

The pixel chip 100 has connection regions 132 provided at both ends of the pixel unit 110. The signal processing chip 200 has a connection area 232 and a global drive unit 234 provided for the peripheral circuit unit 230.

The global drive unit 234 is configured to output a control signal for drive of the pixel 112 to the connection region 232. For example, the global drive unit 234 is configured to output the reset control signal φRST and the selection control signal φSEL, as the control signal.

The connection region 232 is configured to output the control signal from the global drive unit 234 to the connection region 132. In an example, the connection region 232 is electrically connected to the connection region 132 by a conductive via or the like.

The connection region 132 is configured to output the control signal to the pixel unit 110 to control drive of the pixel unit 110. The connection region 132 of the present example is configured to output the control signal to the pixel unit 110 through the global control line 143 extending in the row direction. That is, the image capturing device 400 of the present example is configured to globally control the pixel unit 110 by the reset control signal φRST and the selection control signal φSEL.

The image capturing device 400 of the present example is configured to output the control signal from the signal processing chip 200 to the pixel chip 100 and then to return the pixel signal from the pixel unit 110 to the main circuit unit 210. However, in the image capturing device 400, the global drive unit 234 may be arranged on the pixel chip 100.

Figure 5:
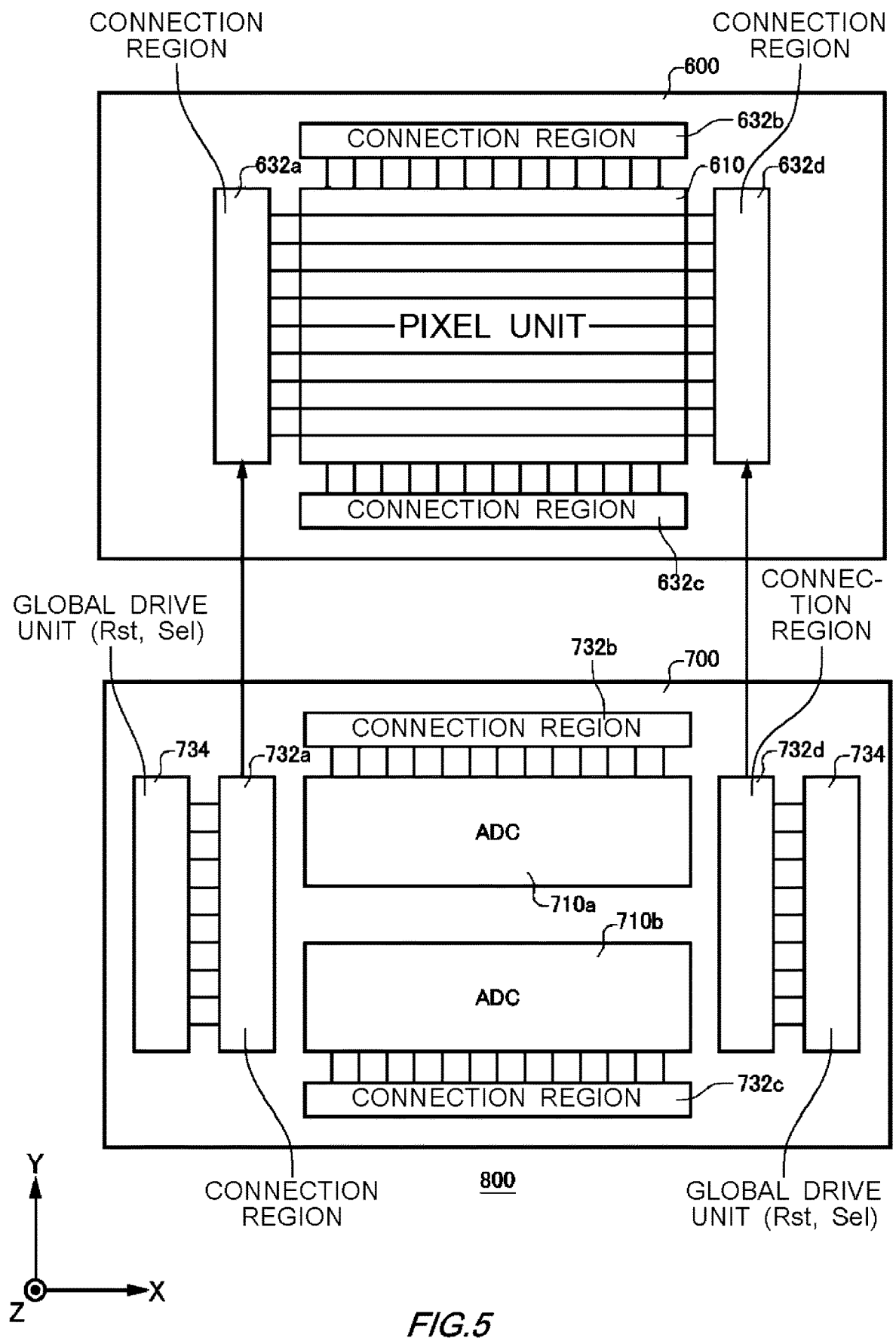
FIG. 5 shows an example of a configuration of an image capturing device 800 according to Comparative Example.

FIG. 5 shows an example of a configuration of an image capturing device 800 according to Comparative Example. A pixel chip 600 has connection regions 632 provided at the periphery of a pixel unit 610. A signal processing chip 700 has connection regions 732 and global drive units 734 provided at the periphery of a main circuit unit 710.

A connection region 632a to a connection region 632d are connected to a connection region 732a to a connection region 732d, respectively. The connection region 632a and the connection region 632d are configured to input control signals to the pixel unit 610.

The pixel unit 610 is configured to output pixel signals to the connection region 632b and the connection region 632c. The connection region 632b and the connection region 632c are configured to output the input pixel signals to the connection region 732b and the connection region 732c of the signal processing chip 200, respectively. The connection region 632b and the connection region 632c are provided at the periphery of the pixel unit 610 and are connected to the pixel unit 610 by wirings extending in the column direction.

Figure 6A:
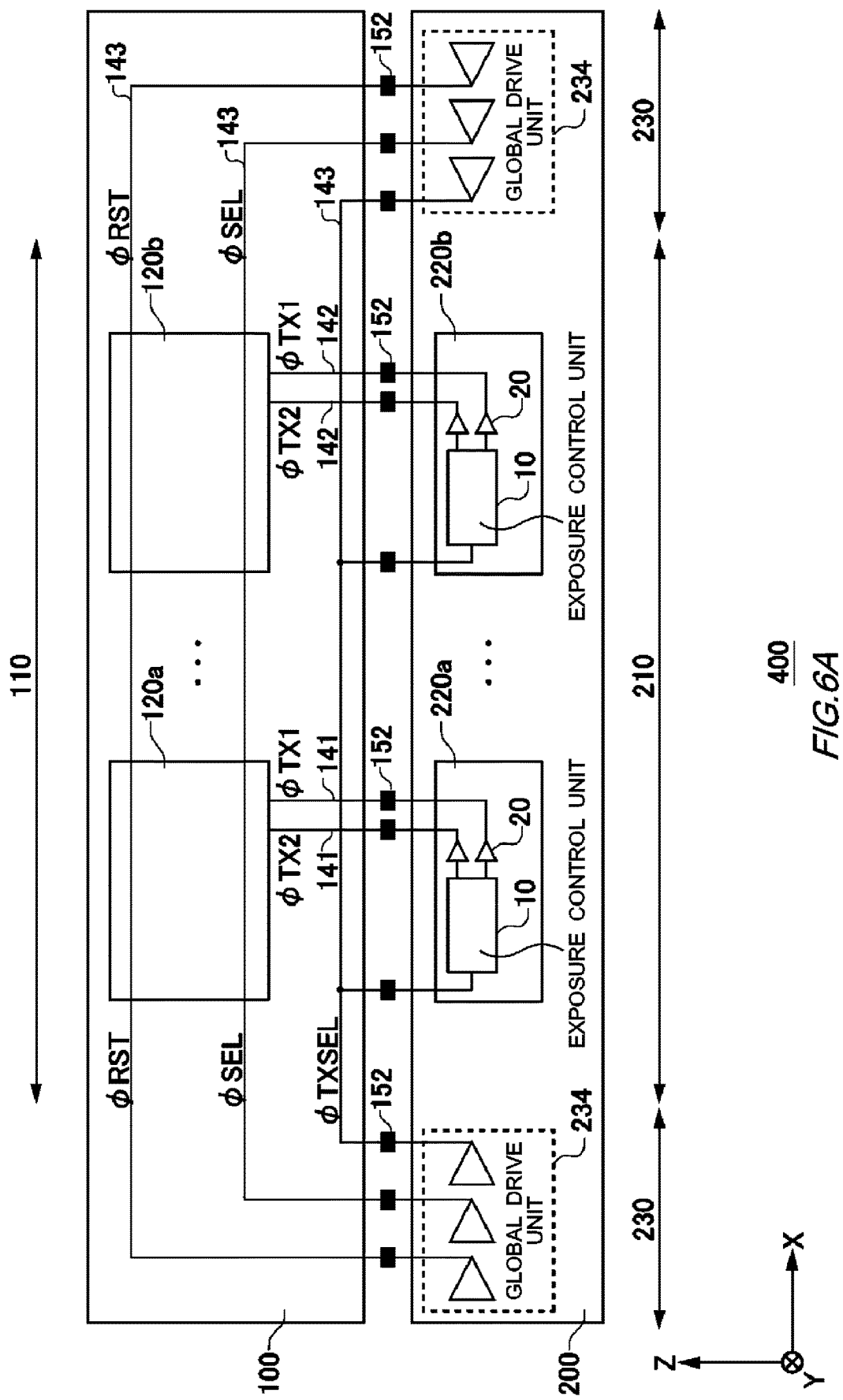
FIG. 6A illustrates an example of a wiring method of the image capturing device 400.

FIG. 6A illustrates an example of a wiring method of the image capturing device 400. The global drive unit 234 of the present example is provided to each of the peripheral circuit units 230 arranged with both ends of the main circuit unit 210 interposed therebetween.

A local control line 141 is connected to a pixel block 120a. The local control line 141 of the present example is connected to gate terminals of the first transfer unit 123 and the second transfer unit 124 provided to the pixel block 120a. The local control line 141 is configured to supply, to the pixel block 120a, the first transfer control signal φTX1 and the second transfer control signal φTX2 output from the control block 220a. The local control line 141 is an example of the first control line connected to the first pixel of the pixel block 120. Note that, the local control line 141 may be provided corresponding to the pixel group 115 of the pixel block 120a. For example, in the pixel group 115, the common local control line 141 is connected to the n pixels 112 aligned in the row direction.

A local control line 142 is connected to a pixel block 120b. The local control line 142 of the present example is connected to gate terminals of the first transfer unit 123 and the second transfer unit 124 provided to the pixel block 120b. The local control line 142 is configured to supply, to the pixel block 120b, the first transfer control signal φTX1 and the second transfer control signal φTX2 output from a control block 220b. The local control line 142 is an example of the second control line connected to the second pixel of the pixel block 120. Note that, the local control line 142 may be provided corresponding to the pixel group 115 of the pixel block 120b. For example, in the pixel group 115, the common local control line 142 is connected to the n pixels 112 aligned in the row direction.

The global drive unit 234 is configured to output a reset control signal φRST, a selection control signal φSEL and a transfer selection control signal φTXSEL. The global drive unit 234 is connected to the global control line 143 configured to output a signal to each pixel block 120. The global drive unit 234 is configured to supply the reset control signal φRST and the selection control signal φSEL to the plurality of pixel blocks 120 via the global control line 143. The global drive unit 234 is configured to supply the transfer selection control signal φTXSEL to the plurality of control blocks 220 via the global control line 143.

The transfer selection control signal φTXSEL is supplied from the global drive unit 234 to the control block 220 so as to control the exposure time of each pixel group 115. The control block 220 supplied with the transfer selection control signal φTXSEL is configured to output the transfer selection control signal φTXSEL to the corresponding pixel block 120. The pixel block 120 is configured to determine whether to input the transfer selection control signal φTXSEL to the pixel 112 as the first transfer control signal φTX1 or the second transfer control signal φTX2. Thereby, the input of the first transfer control signal φTX1 or the second transfer control signal φTX2 to the pixel 112 is skipped.

For example, the control block 220 is configured to extend the exposure time by skipping the first transfer control signal φTX1 when the first transfer control signal φTX1 determines an end time of exposure. In addition, the control block 220 can shorten the exposure time by skipping the first transfer control signal φTX1 when the first transfer control signal φTX1 determines a start time of exposure. In this way, the exposure time of the pixel group 115 can be adjusted by the transfer selection control signal φTXSEL. The same is true when the second transfer control signal φTX2 determines the start time or end time of exposure.

The global control line 143 is provided in common to the plurality of pixel blocks 120. The global control line 143 of the present example is wired across the pixel chip 100 in the row direction. The global control line 143 may be wired across the pixel chip 100 in the column direction. The global control line 143 is an example of the third control line provided in common to a pixel connected to the local control line 141 and a pixel connected to the local control line 142.

For example, the global control line 143 is connected to the gate terminals of the reset unit 126 and the selecting unit 129 of the pixel block 120 and is configured to supply the reset control signal φRST and the selection control signal φSEL. In addition, the global control line 143 is connected to each of the plurality of control blocks 220 and is configured to supply the transfer selection control signal φTXSEL to the exposure control unit 10.

Note that, the global drive unit 234 of the present example is configured to output the transfer selection control signal φTXSEL from the signal processing chip 200 to the pixel chip 100, but may also be configured to output the transfer selection control signal φTXSEL to the control block 220 without supplying the same to the pixel chip 100. In this case, the global control line 143 is provided to the signal processing chip 200.

A plurality of bumps 152 is provided on a joining surface at which the pixel chip 100 and the signal processing chip 200 are joined to each other. The bumps 152 of the pixel chip 100 are positionally aligned with the bumps 152 of the signal processing chip 200. The plurality of bumps 152 facing each other are joined and thus electrically connected by a pressurization treatment or the like on the pixel chip 100 and the signal processing chip 200.

The image capturing device 400 of the present example is configured to control the exposure time for each pixel group 115 by changing a timing of at least one of the first transfer unit 123 and the second transfer unit 124 by the local control line. The image capturing device 400 can implement control of the exposure time with fewer control lines by combining the local control line and the global control line.

Figure 6B:
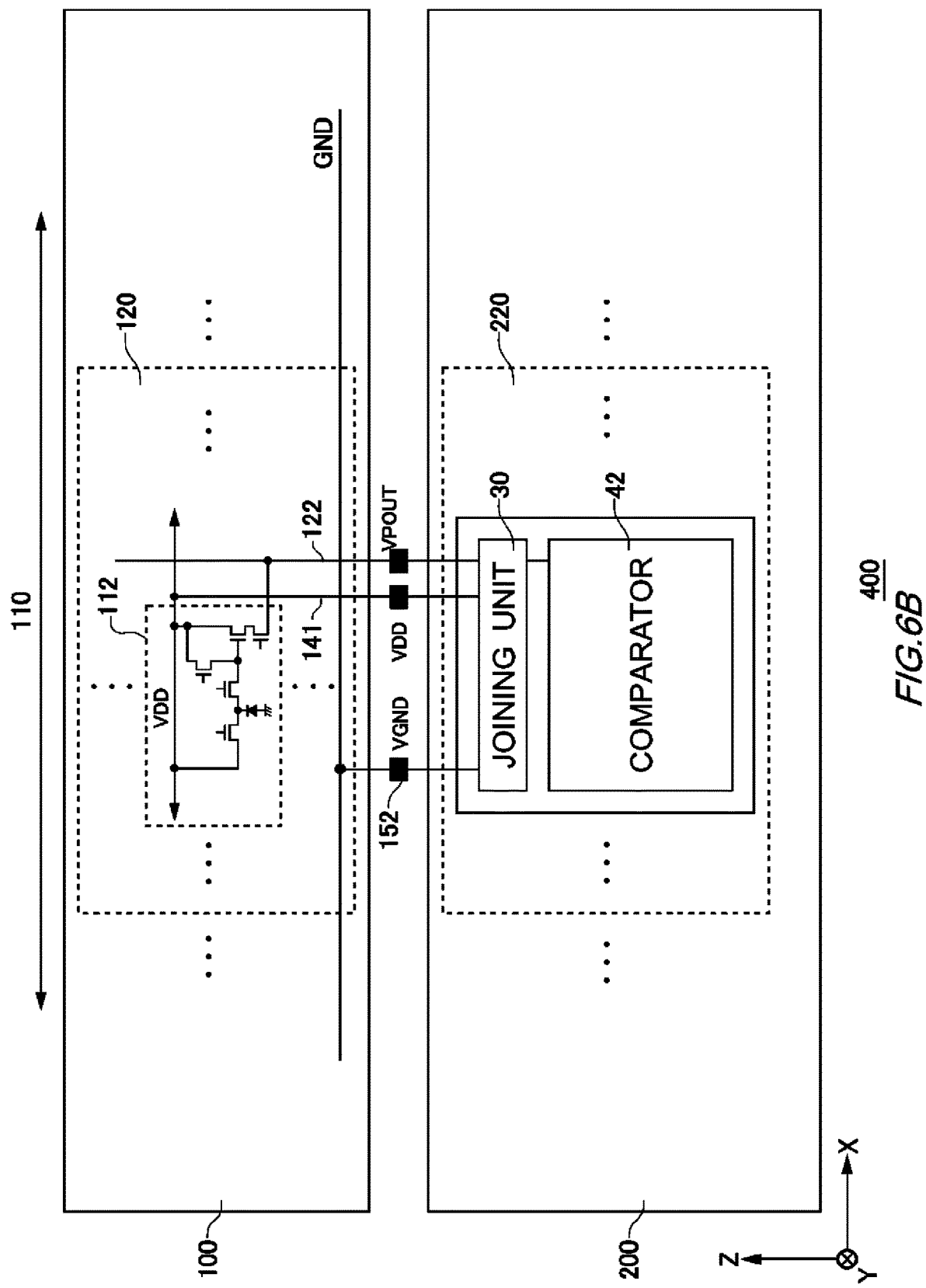
FIG. 6B illustrates an example of the wiring method of the image capturing device 400.

FIG. 6B illustrates an example of the wiring method of the image capturing device 400. In the present example, a wiring for inputting a pixel signal from the pixel 112 to the control block 220 is shown.

A ground wiring GND is set to a predetermined reference potential VGND. The ground wiring GND of the present example is wired across the pixel chip 100 in the row direction. The ground wiring GND is connected to the joining unit 30 of the control block 220 via the bump 152.

The joining unit 30 is connected to an output wiring for a voltage VPOUT and a power supply wiring for a voltage VDD. The joining unit 30 is connected to the ground wiring GND set to the reference potential VGND. The joining unit 30 is configured to output a pixel signal to the correspondingly provided comparator 42. For example, the n comparators 42 are provided in the row direction.

Figure 7A:
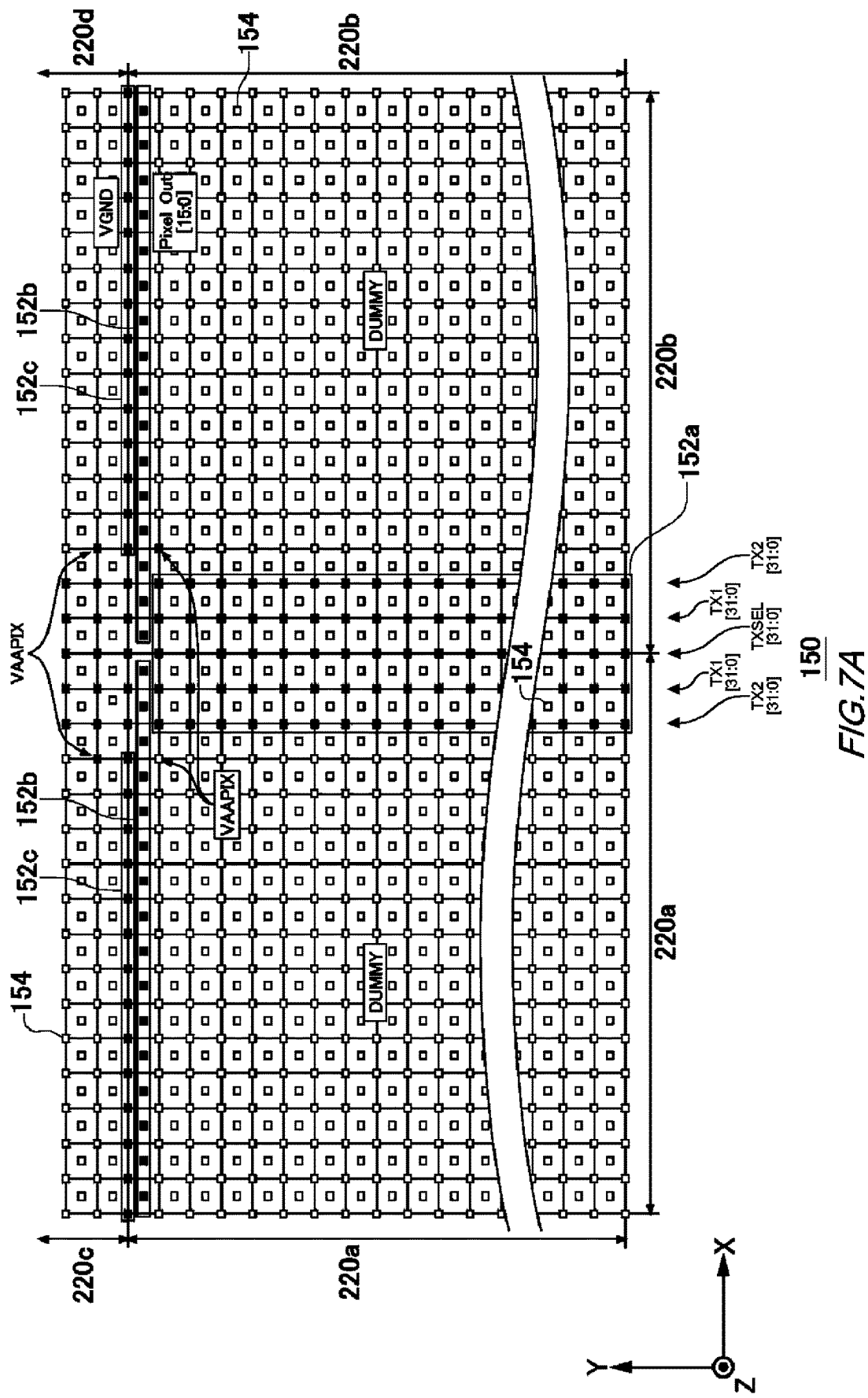
FIG. 7A shows an example of a joining surface 150 of a pixel chip 100 and a signal processing chip 200.

FIG. 7A shows an example of a joining surface 150 of the pixel chip 100 and the signal processing chip 200. In the present example, a region in which the four control blocks 220a to 220d are adjacent is shown.

Bumps 152a supply the first transfer control signal φTX1, the second transfer control signal φTX2 and the transfer selection control signal φTXSEL. The bumps 152a are provided at positions corresponding to the pixel drive unit 20. The bumps 152a are provided at four corners of a square corresponding to each pixel 112. A dummy bump 154 may be provided at the center of the square at which the four bumps 152a are provided. In the present example, the m (for example, 32) bumps 152a are provided in the column direction. Among the bumps 152a, a bump for supplying the transfer selection control signal φTXSEL may be shared by the control block 220a and the control block 220b.

Bumps 152b are configured to output pixel signals from the pixel 112. The bumps 152b are provided at positions corresponding to the joining unit 30. The bumps 152b are provided in a region adjacent to the bumps 152a and the dummy bumps 154. The bump 152b of the present example is provided at the center of the square corresponding to each pixel 112. The n (for example, 16) bumps 152b are provided side by side in the row direction for one control block 220.

Bumps 152c are bumps for connecting the control block 220 to the ground voltage GND. The bumps 152c are provided at positions corresponding to the joining unit 30. The bumps 152c of the present example are provided at two corners of a square corresponding to each pixel 112. For example, the 14 bumps 152 are provided side by side in the row direction.

The dummy bumps 154 are arranged in regions in which the bumps 152 are not provided. The dummy bumps 154 may be electrically insulated from a circuit. The dummy bumps 154 of the present example are regularly provided for each pixel 112, but are not limited thereto. The dummy bumps 154 may be provided for promoting heat dissipation. The dummy bumps 154 of the present example are provided both at four corners of a square corresponding to each pixel 112 and at the center of the square.

Figure 7B:
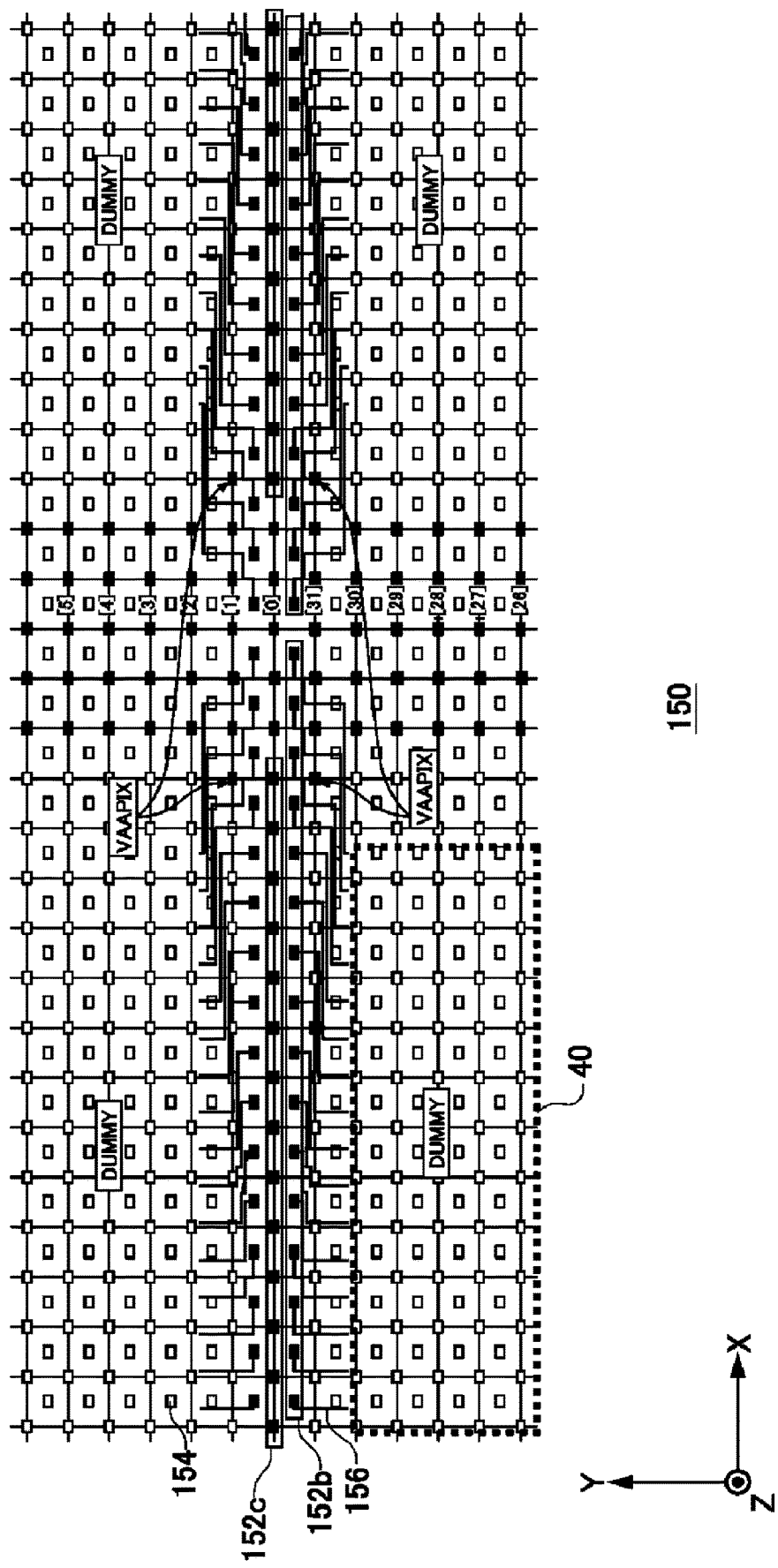
FIG. 7B shows an example of an enlarged view of the joining surface 150.

FIG. 7B shows an example of an enlarged view of the joining surface 150. The bumps 152b are connected to the control blocks 220 by the wirings 156.

The wirings 156 connect the bumps 152b and the signal converting unit 40 each other. Then wirings 156 are provided corresponding to then bumps 152b aligned in the row direction. The n bumps 152b aligned in the row direction are connected to the n comparators 42 aligned in the row direction.

Here, while the bumps 152b are evenly arranged with respect to the 16 pixels 112, a width in the row direction of the signal converting unit 40 is short because the pixel drive unit 20 is arranged. For this reason, a linear distance between the bump 152b and a corresponding connection destination of the signal converting unit 40 is different for each wiring 156. The wirings 156 of the present example are adjusted so that lengths are equal to each other even when the linear distances of both ends of the wirings 156 are different. Thereby, an inter-pixel delay of the pixel signals output from the pixels 112 is eliminated, so that the pixel signal can be uniformly output for each column. Note that, in the present example, the inter-pixel delay is eliminated by changing the length of the wiring 156. However, the inter-pixel delay may also be eliminated by changing a width of the wiring 156.

Figure 8A:
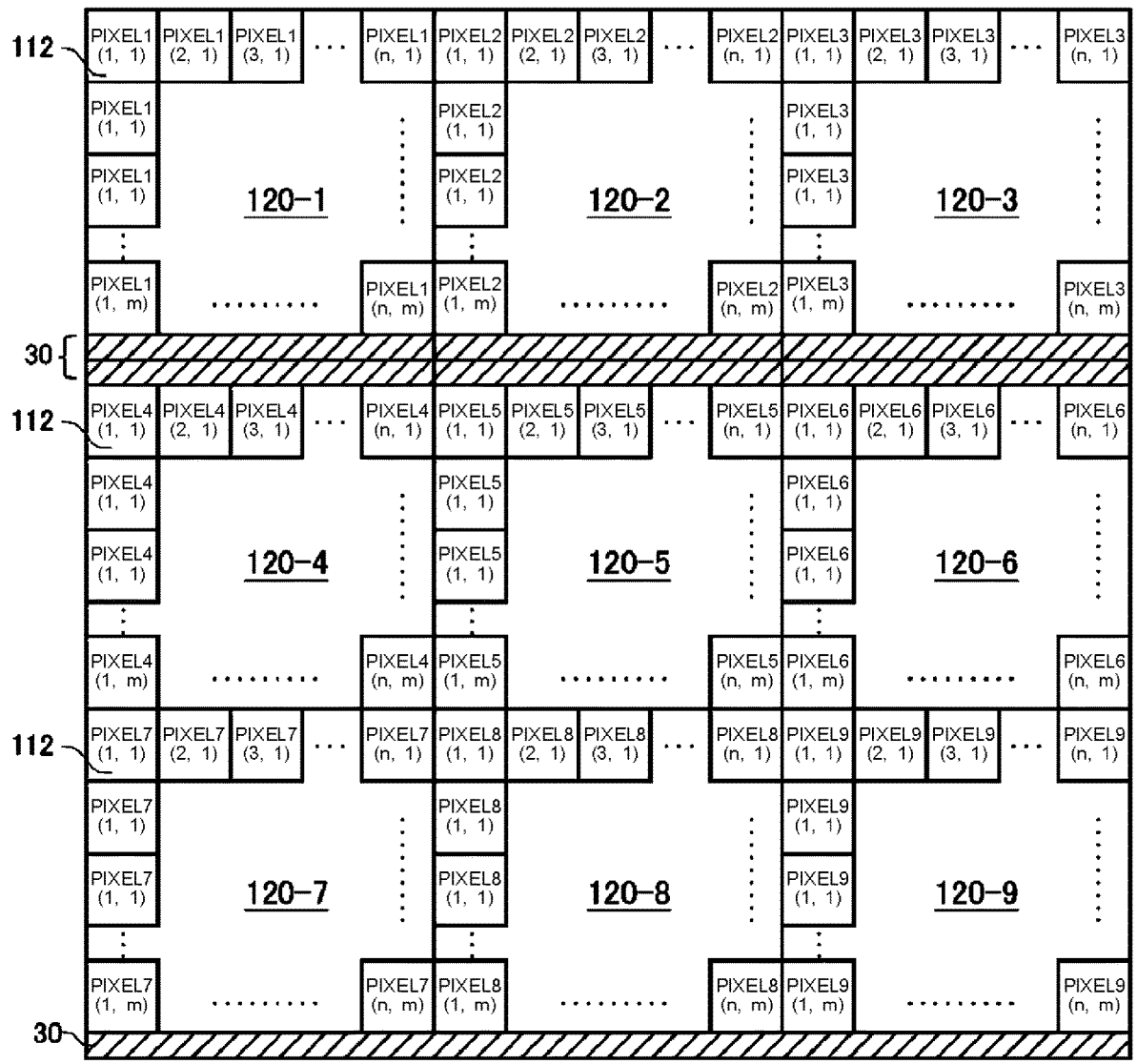
FIG. 8A shows an example of a configuration of the pixel unit 110 according to the embodiment.

FIG. 8A shows an example of a configuration of the pixel unit 110 according to the embodiment. The pixel block 120 of the present example has the plurality of pixels 112 and the joining unit 30. The pixel block 120 has m×n pixels 112. In the present example, nine pixel blocks 120-1 to 120-9 are exemplified and described. Note that, in the present example, a case where the pixel blocks 120 are provided in one-to-one correspondence with the pixel groups 115 will be described.

The pixel blocks 120 are reversedly arranged. For example, a pixel block 120-1 is reversedly arranged with respect to a pixel block 120-4. Therefore, the joining unit 30 of the pixel block 120-1 is arranged adjacent to the joining unit of the pixel block 120-4. This can improve the layout efficiency.

Figure 8B:
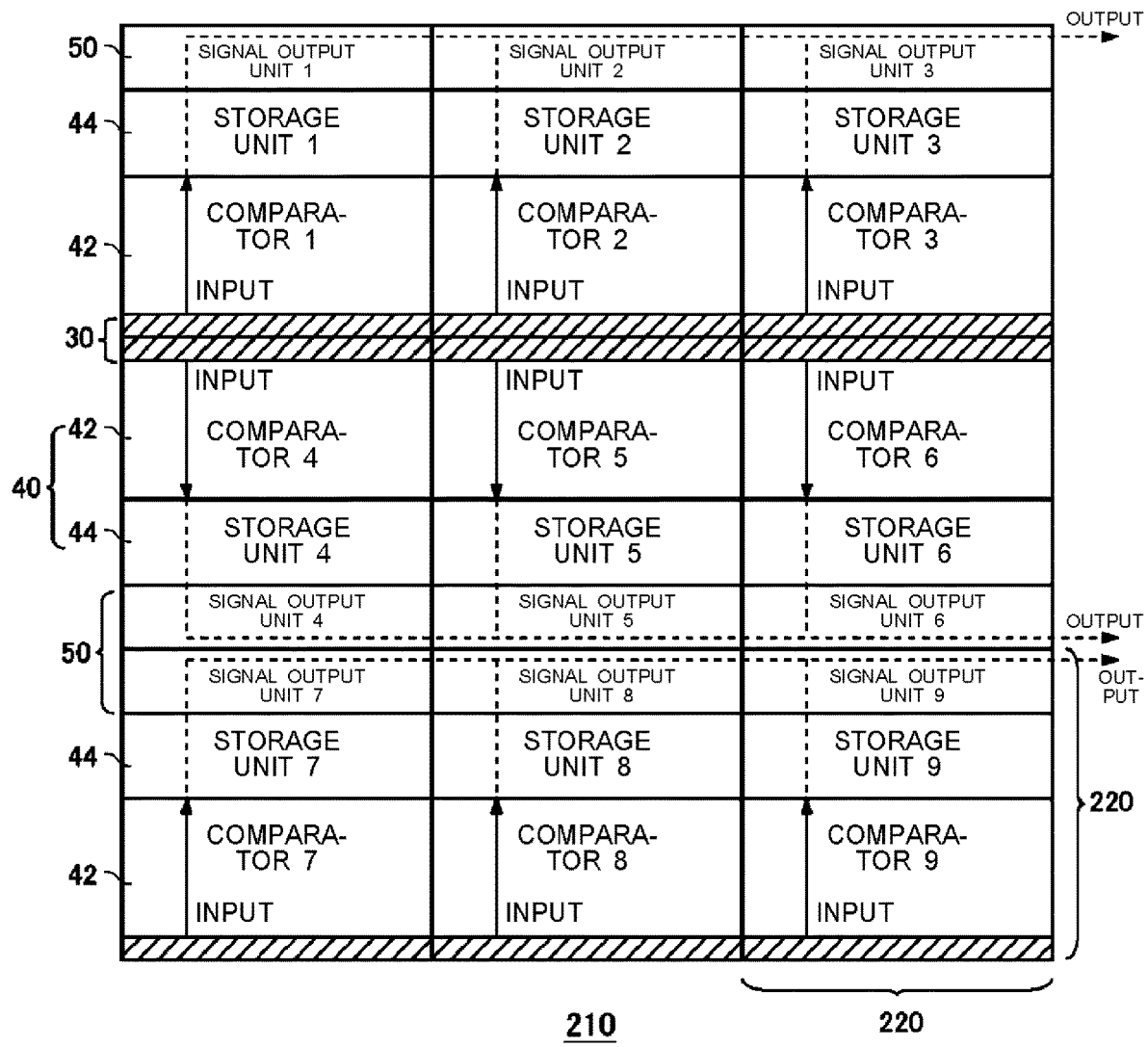
FIG. 8B shows an example of a configuration of the main circuit unit 210 according to the embodiment.

FIG. 8B shows an example of a configuration of the main circuit unit 210 according to the embodiment. The control block 220 of the present example includes the joining unit 30, the signal converting unit 40 and the signal output unit 50. The signal converting unit 40 has the comparator 42 and the storage unit 44. In the present example, the nine control blocks 220 will be exemplified and described. An input analog signal is indicated by a straight line arrow, and an output digital signal is indicated by a dashed arrow.

The comparator 42 is configured to convert an image signal input from the pixel chip 100 into a digital signal. The comparator 42 is provided adjacent to the joining unit 30.

The storage unit 44 is configured to store the digital signal from the comparator 42. The storage unit 44 is provided adjacent to the comparator 42.

The signal output unit 50 is configured to output the digital signal output by the comparator 42 in a predetermined output direction (for example, the row direction). The digital signal stored in the storage unit 44 has been input to the signal output unit 50 of the present example. The signal output unit 50 is connected to an output wiring wired across the main circuit unit 210 in the row direction. In the main circuit unit 210 of the present example, the signal output units 50 of the control blocks 220 adjacent in the column direction can be collectively arranged. Thereby, since the digital signal lines can be collectively arranged, the layout efficiency is improved.

The joining unit 30 is configured to join the pixel chip 100 and the signal processing chip 200 each other. The joining units 30 are reversedly arranged in the column direction. In the present example, the joining units 30 and comparators 42 of the control blocks 220 adjacent in the column direction can be collectively arranged. The joining unit 30 of the present example is provided extending in a predetermined extension direction (for example, the row direction) and is configured to connect the pixel chip 100 and the signal processing chip 200 each other.

The joining units 30 and the storage units 44 of the present example are reversedly arranged in the control blocks 220 adjacent in a direction (for example, the column direction) different from the extension direction. The joining units 30, and the comparators 42 and storage units 44 of the present example are reversedly arranged in the control blocks 220 adjacent in a direction (for example, the column direction) different from the output direction.

Here, the joining unit 30 and the comparator 42 have analog signal lines as ADC input units. On the other hand, the storage unit 44 and the signal output unit 50 have digital signal lines for handling AD-converted signals. Therefore, the main circuit unit 210 can secure an interval between the analog signal line and the digital signal line between the plurality of adjacent control blocks 220 to suppress digital noise contamination.

Figure 8C:
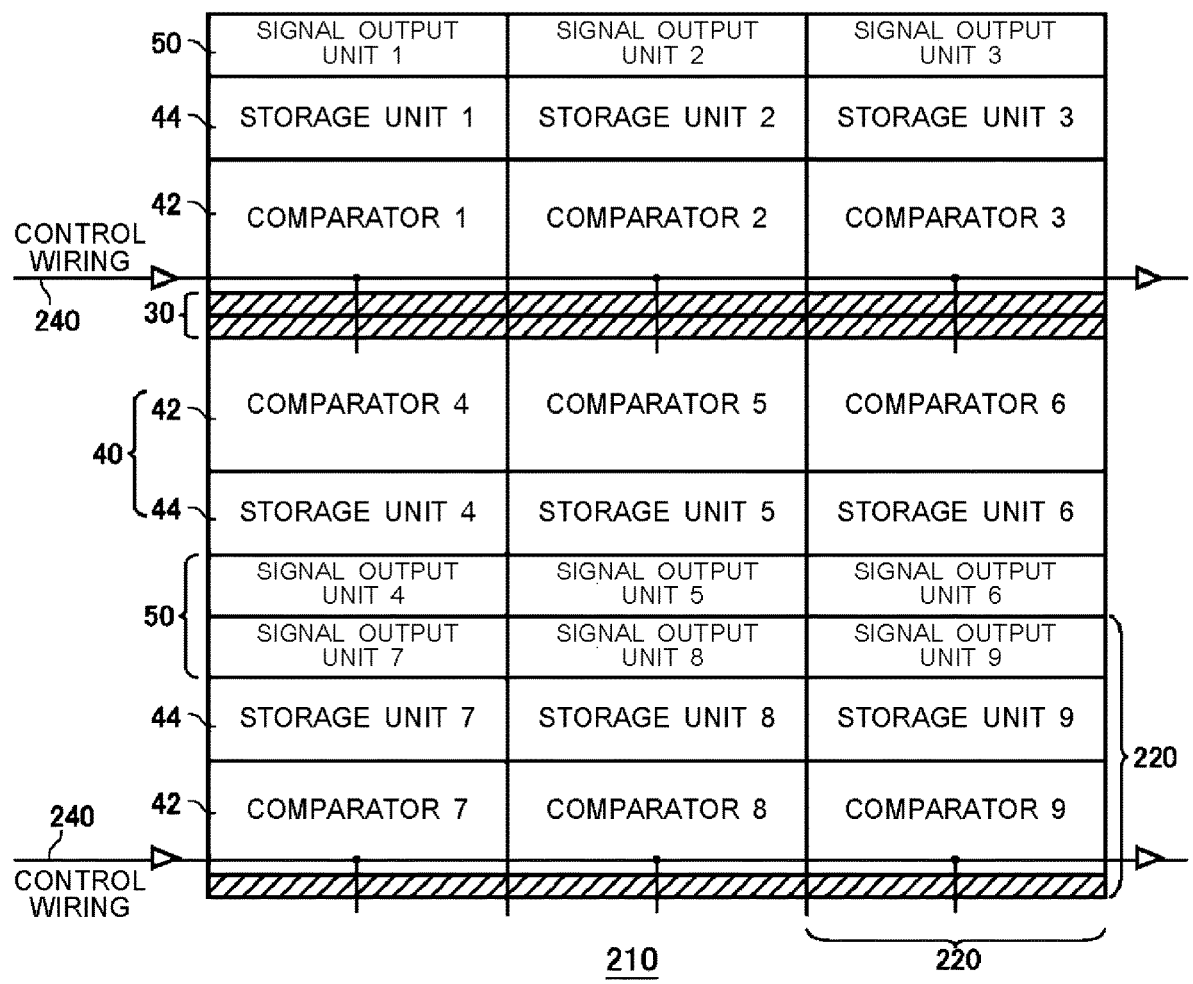
FIG. 8C shows an example of the main circuit unit 210 corresponding to the pixel unit 110 of FIG. 8A.

FIG. 8C shows an example of the main circuit unit 210 corresponding to the pixel unit 110 of FIG. 8A. The image capturing device 400 has a plurality of control wirings 240. Note that, in the present example, a case where the plurality of control wirings 240 extend in the row direction will be described. However, the present invention can also be applied to the plurality of control wirings 240 extending in the column direction by changing the direction of the reverse arrangement of the control blocks 220.

The control wiring 240 is provided extending in a predetermined wiring direction (for example, the row direction). The control wirings 240 of the plurality of control blocks 220 arranged side by side in the wiring direction among the plurality of control blocks 220 are provided shared with the control wirings 240 of the control blocks 220 adjacent in a direction (for example, the column direction) different from the wiring direction. By sharing the control wirings 240 between the adjacent control blocks 220, the number of the control wires 240 can be reduced.

Figure 9A:
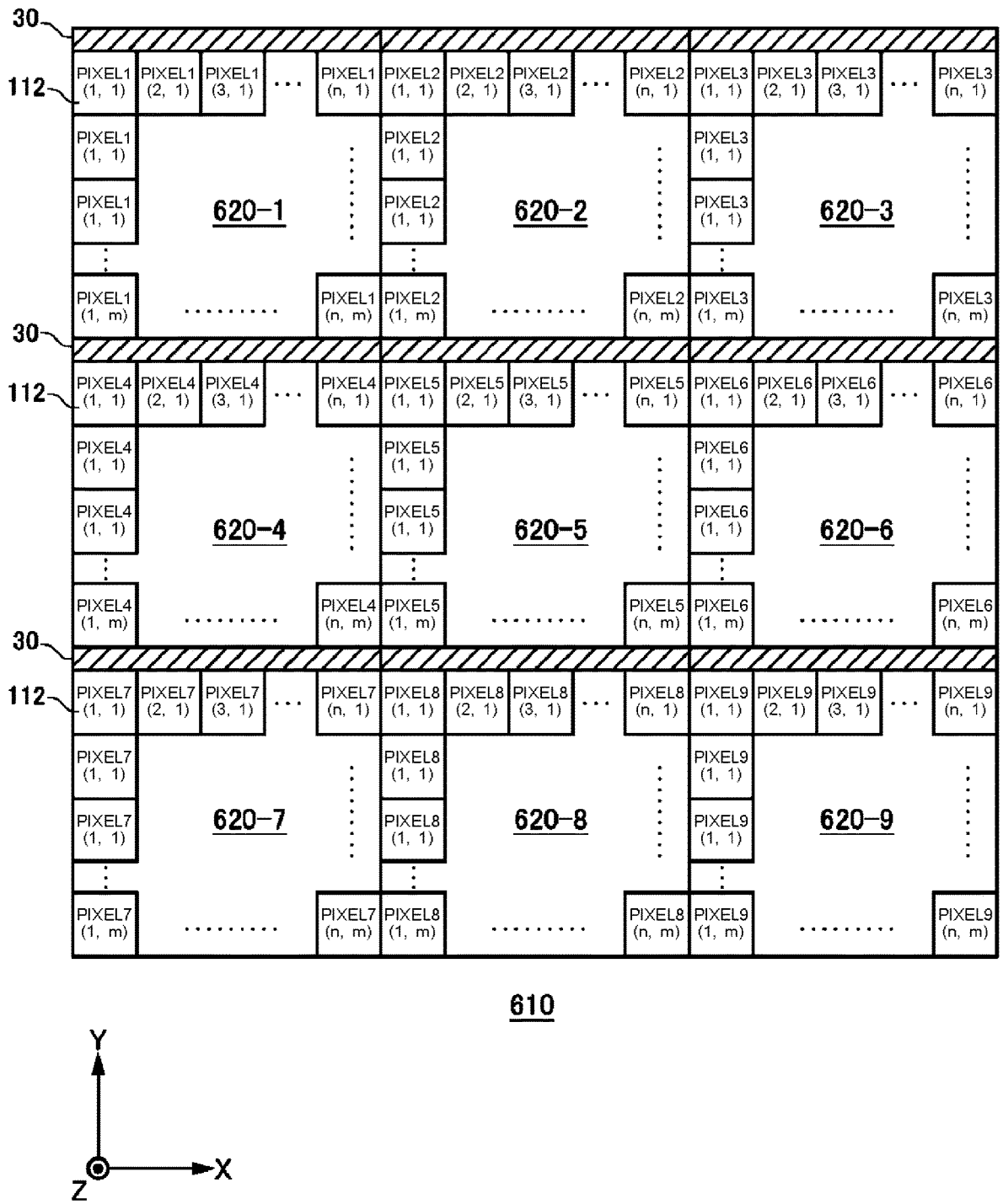
FIG. 9A shows an example of a configuration of a pixel unit 610 according to Comparative Example.

FIG. 9A shows an example of a configuration of the pixel unit 610 according to Comparative Example. In the pixel unit 610, the pixel blocks 620 are not reversedly arranged. That is, each of the pixel blocks 620 is arranged in parallel displacement on the XY plane.

Figure 9B:
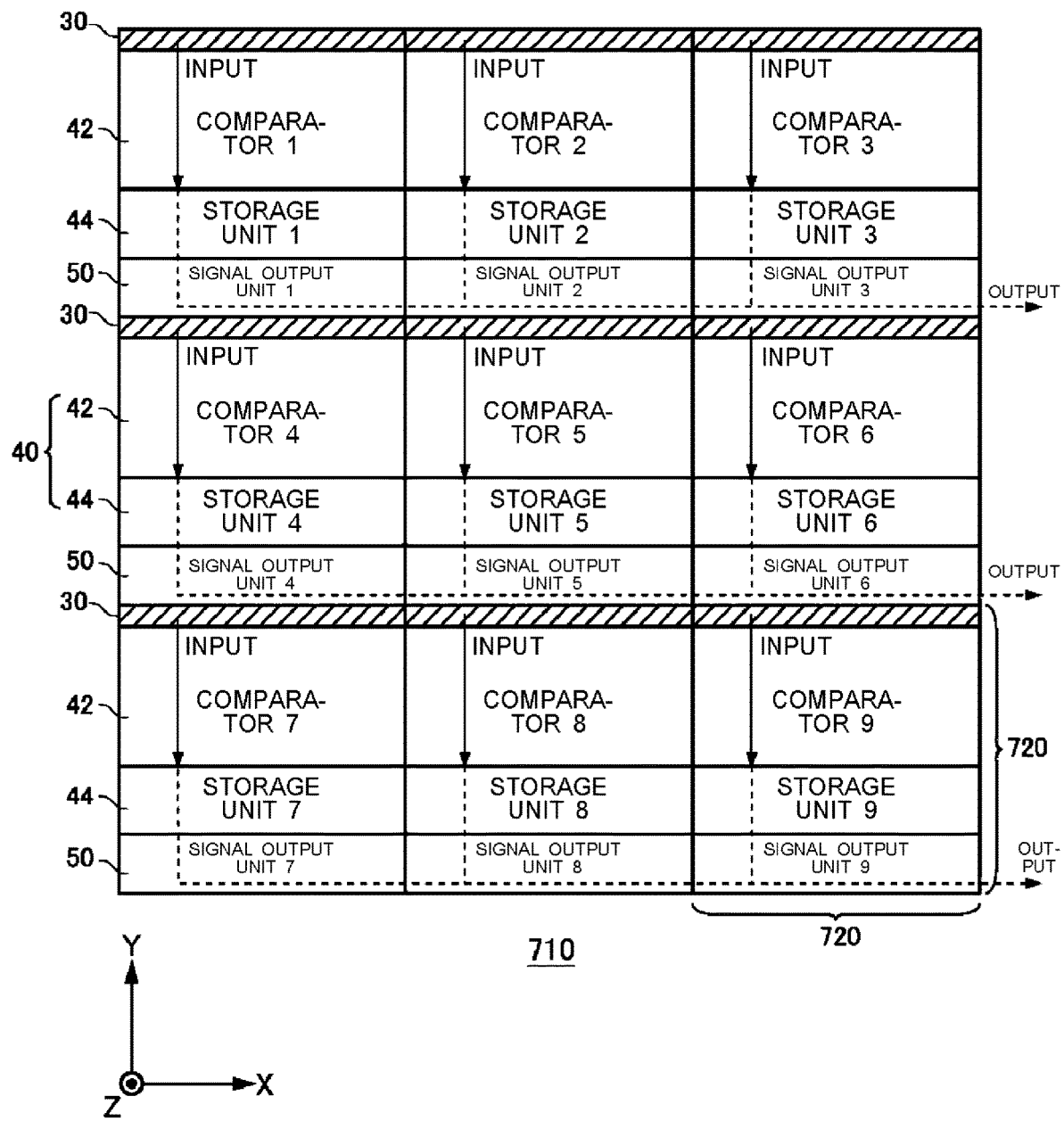
FIG. 9B shows an example of a configuration of a main circuit unit 710 according to Comparative Example.

FIG. 9B shows an example of a configuration of the main circuit unit 710 according to Comparative Example. In the main circuit unit 710, the control blocks 720 are not reversedly arranged. Therefore, the joining unit 30 to which an analog signal is input and the signal output unit 50 configured to output a digital signal are provided adjacent in the column direction. Thereby, in the main circuit unit 710, interference may occur between the analog signal line and the digital signal line.

Figure 9C:
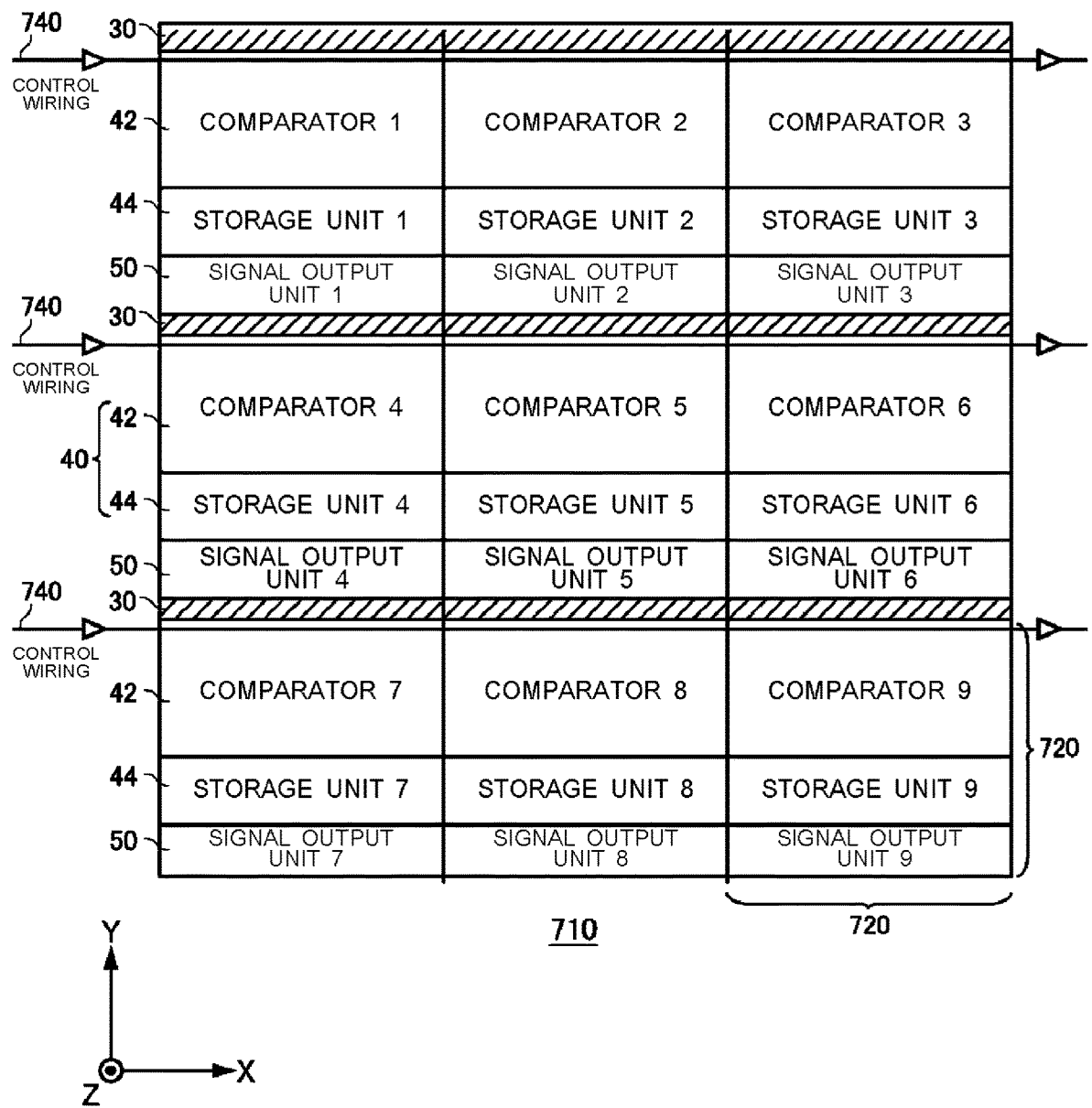
FIG. 9C shows an example of a configuration of the main circuit unit 710 according to Comparative Example.

FIG. 9C shows an example of a configuration of the main circuit unit 710 according to Comparative Example. In the main circuit unit 710, the control blocks 720 are not reversedly arranged. For this reason, it is necessary to provide a control wiring 740 for each of the control blocks 720. Therefore, the number of the control wirings 740 cannot be reduced.

Figure 10A:
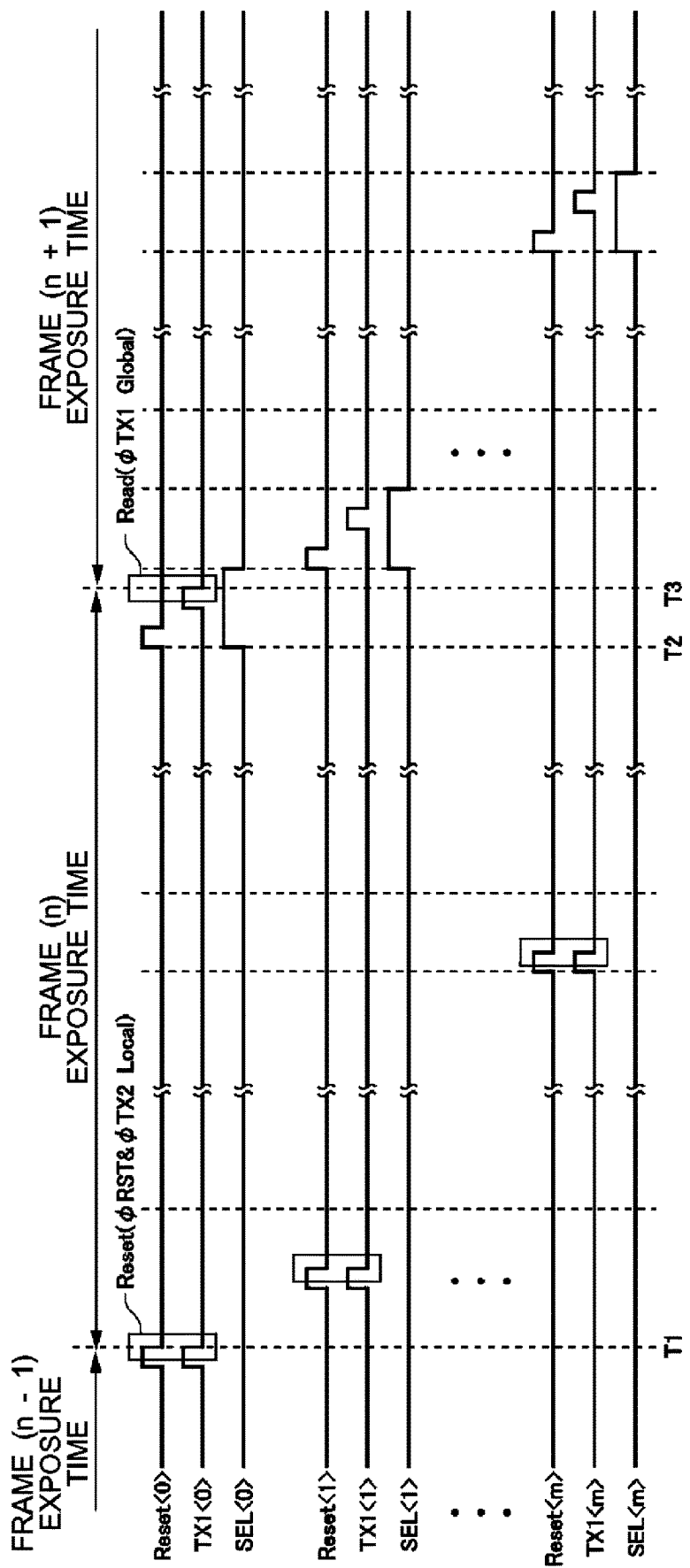
FIG. 10A shows an example of a timing chart showing an image capturing operation of the image capturing device 400.

FIG. 10A shows an example of a timing chart showing an image capturing operation of the image capturing device 400. The present example shows an example of a control method for the reset control signal φRST, the first transfer control signal φTX1, and the selection control signal φSEL.

The first transfer control signal φTX1 and a control signal Reset control a timing to start exposure. The start timing of exposure is a fall timing (time T1) of the first transfer control signal φTX1 and the control signal Reset. Turning on the control signal Reset corresponds to turning on both the reset control signal φRST and the second transfer control signal φTX2. By turning on both the reset control signal φRST and the second transfer control signal φTX2, the electric charges accumulated in the photoelectric converting unit 104 are discharged. The second transfer control signal φTX2 is a locally controlled signal.

The first transfer control signal φTX1 turns on the first transfer unit 123 to transfer the electric charges accumulated in the photoelectric converting unit 104 to the accumulating unit 125. The first transfer control signal φTX1 controls a timing to end exposure. The end timing of exposure is a fall timing (time T3) of the first transfer control signal φTX1. Since the first transfer control signal φTX1 of the present example is a globally controlled signal, the timing to end exposure in each pixel group 115 is the same. In addition, the first transfer control signal φTX1 turns on the first transfer unit 123 simultaneously with the control signal Reset, thereby discharging the electric charges remaining in the photoelectric converting unit 104.

The selection control signal φSEL is a signal for selecting an arbitrary pixel 112. The selection control signal φSEL controls on/off of the selecting unit 129. At time T2, the selection control signal φSEL is set high. The pixel 112 for which the selection control signal φSEL is set high outputs a pixel signal to the signal line 122, in response to turn-on of the first transfer control signal φTX1. On the other hand, the pixel 112 for which the selection control signal φSEL is not set high does not output a pixel signal.

The image capturing device 400 of the present example can control the exposure time for each pixel group 115 by locally controlling the second transfer control signal φTX2 to change the start timing of exposure for each pixel group 115. Further, the image capturing device 400 may control the end timing of exposure for each pixel group 115 by locally controlling the first transfer control signal φTX1. The image capturing device 400 may control both the start timing and the end timing of exposure for each pixel group 115 by locally controlling both the first transfer control signal φTX1 and the second transfer control signal φTX2.

Figure 10B:
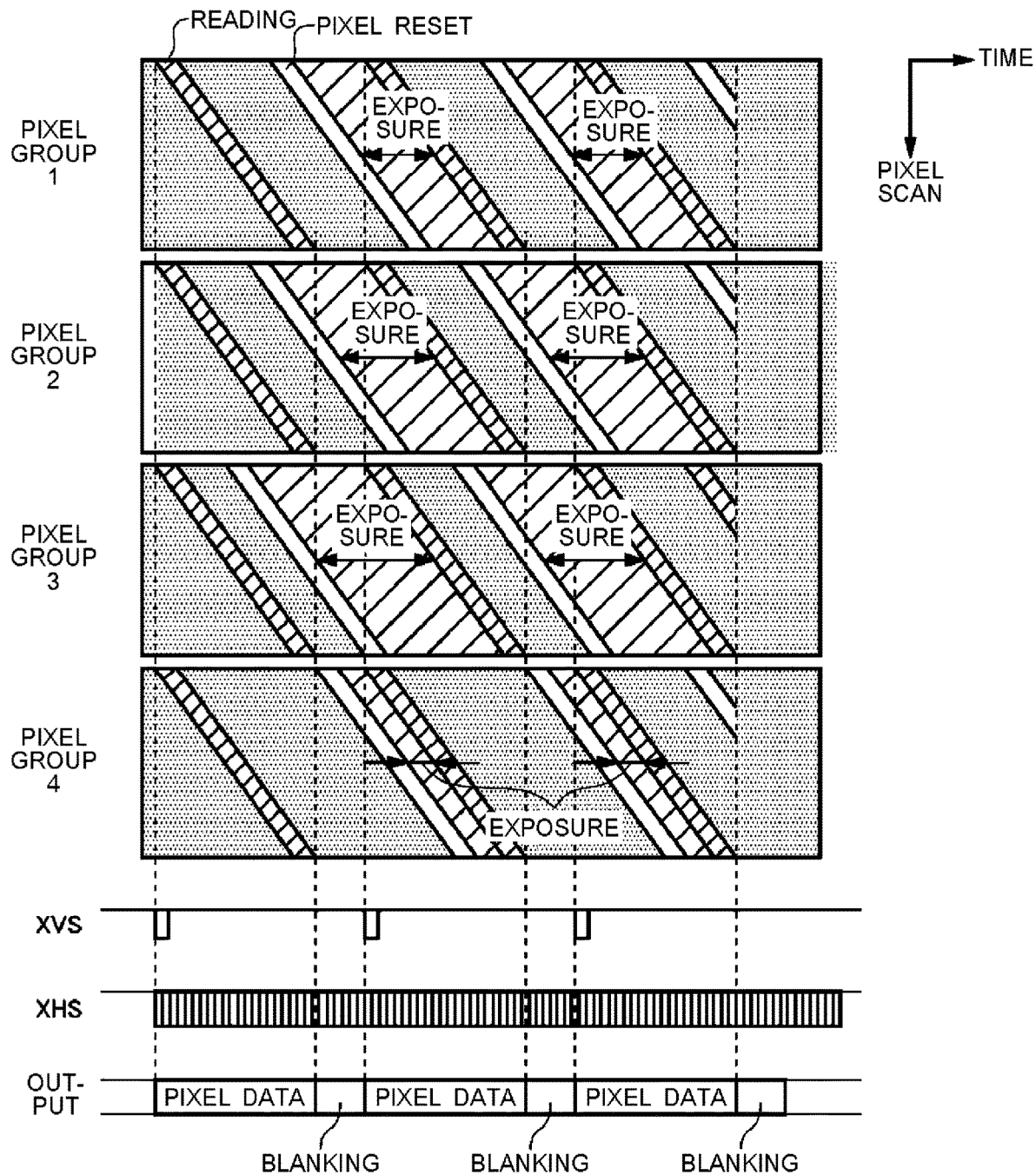
FIG. 10B shows an example of an exposure timing for each pixel group 115.

FIG. 10B shows an example of an exposure timing for each pixel group 115. In the present example, for the four pixel groups 115, the exposure time is controlled for each of the pixel groups 115.

The image capturing device 400 changes an amount of exposure by shifting a time of pixel reset for each pixel group 115. For this reason, in each pixel group 115, the end time of exposure (i.e., reading time) is the same, but the start time of exposure (i.e., pixel reset time) is changed. Thereby, the image capturing device 400 can set different exposure times for the respective pixel groups 115.

A vertical synchronizing signal (XVS) and a horizontal synchronizing signal (XHS) control reading of image data by the image capturing device 400. The vertical synchronizing signal is switched at a timing corresponding to the number of pixels in the column direction of the control block 220. The horizontal synchronizing signal is switched at a timing corresponding to the number of pixels in the row direction of the control block 220. The read data may be output as image data in subsequent frames.

Figure 11A:
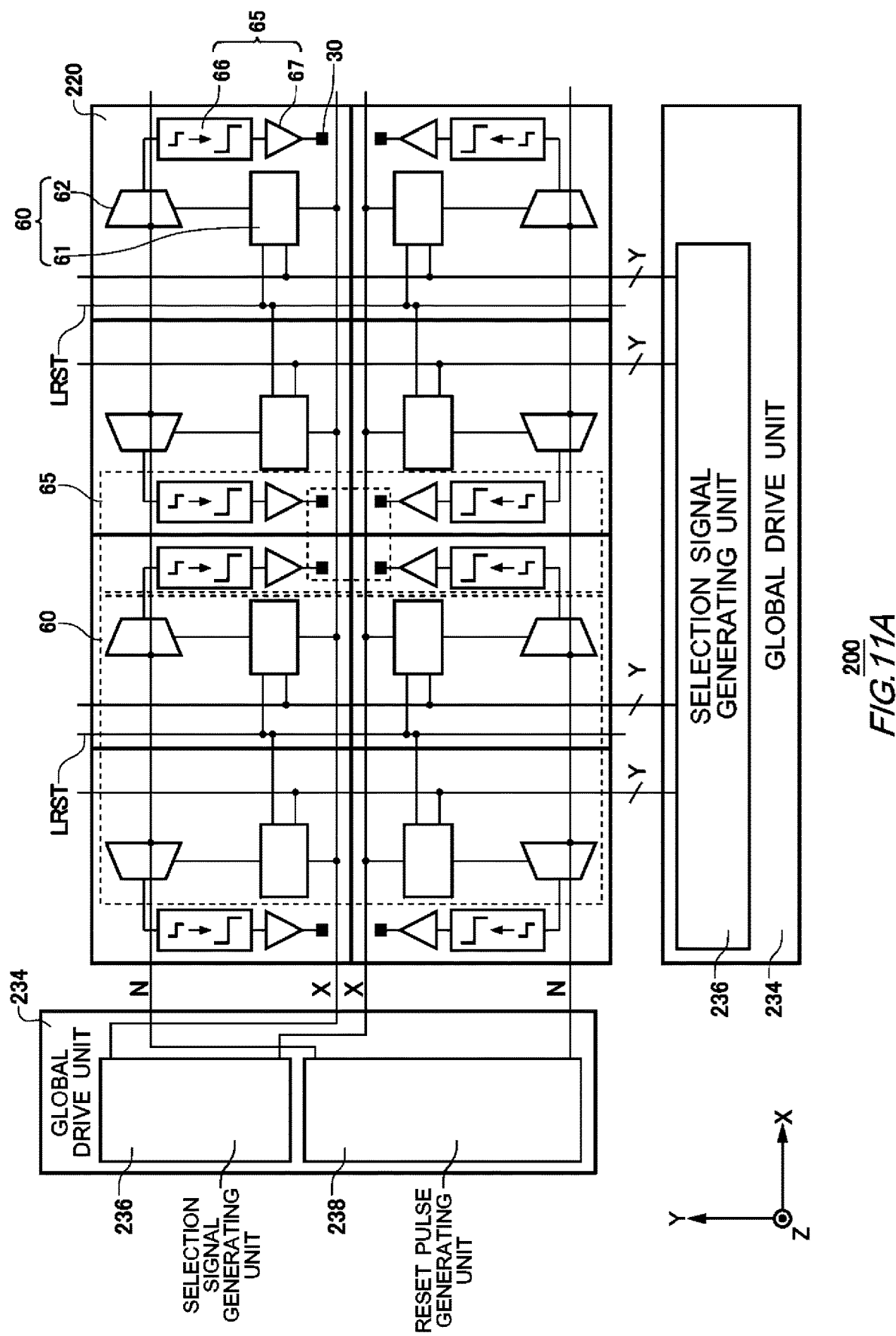
FIG. 11A shows an example of a configuration of the signal processing chip 200.

FIG. 11A shows an example of a configuration of the signal processing chip 200. The control block 220 includes a logic circuit 60 and an analog circuit 65. The logic circuit 60 has a latch 61 and a selector 62. The analog circuit 65 has a level shifter 66 and a buffer 67. The global drive unit 234 of the present example has a selection signal generating unit 236 and a reset pulse generating unit 238.

The selection signal generating unit 236 is configured to input a selection signal for selecting the pixel 112 to the latch 61. The reset pulse generating unit 238 is configured to input the transfer selection control signal φTXSEL to the selector 62. The selection signal generating unit 236 and the reset pulse generating unit 238 are configured to output digital signals.

The logic circuit 60 has a transistor for processing a digital signal. The logic circuit 60 is configured to operate, in response to the digital signals input from the selection signal generation unit 236 and the reset pulse generation unit 238.

The analog circuit 65 has a transistor for processing an analog signal. The level shifter 66 is configured to convert the digital signal input from the logic circuit 60 into an analog signal. The buffer 67 is configured to output the analog signal to the pixel unit 110 through the joining unit 30. The analog circuits 65 of the present example are collectively arranged in the four control blocks 220 adjacent in the row direction and the column direction. This can improve the layout efficiency.

The joining units 30 are collectively arranged in the four control blocks 220 adjacent in the row direction and the column direction. That is, since prohibited areas around the joining unit 30 can be collectively arranged, the layout becomes easier and a circuit area can be reduced.

Therefore, in the signal processing chip 200 of the present example, since the level shifter 66 is arranged for each control block 220, the latch 61 and the selector 62 can be configured by digital transistors. Thereby, the circuit area can be reduced, as compared to a case where the logic circuit 60 is configured by analog transistors. Further, in the signal processing chip 200, since the level shifter 66 can be arranged immediately near the pixel unit 110, an output load can be reduced and a circuit scale of the level shifter 66 can be reduced.

Figure 11B:
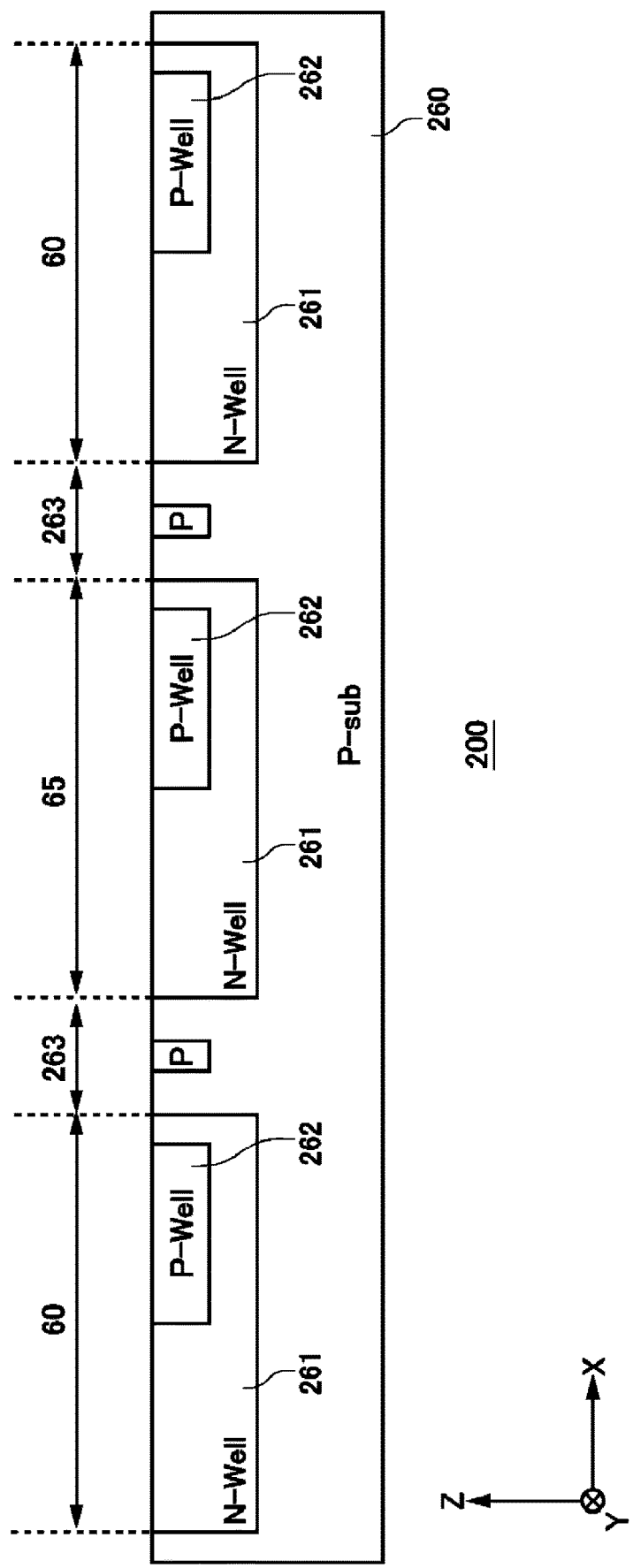
FIG. 11B shows an example of a cross-sectional view of the signal processing chip 200.

FIG. 11B shows an example of a cross-sectional view of the signal processing chip 200. The cross-sectional view of the present example is an example of the XZ cross-sectional view passing through the logic circuit 60 and the analog circuit 65.

A semiconductor substrate 260 has a first well region 261 and a second well region 262. The conductivity type of the present example is such that the semiconductor substrate 260 is P type, the first well region 261 is N type and the second well region 262 is P type, but is not limited thereto. In the first well region 261 and the second well region 262, circuits such as transistors that constitute the signal processing chip 200 are formed.

A well isolation region 263 is provided to isolate the adjacent first well regions 261. The well isolation region 263 is configured to isolate the first well region 261 at an interval equal to or greater than a predetermined size, according to manufacturing process rules. The signal processing chip 200 of the present example can reduce the number of well isolation regions 263 required to isolate the first well regions 261 by sharing the first well regions 261 in the adjacent control blocks 220.

For example, the signal processing chip 200 can share the well isolation region 263 by providing the level shifters 66 of the control blocks 220 adjacent in the row direction or the column direction in a common well region. This makes it possible to reduce a circuit area of the signal processing chip 200.

Figure 12A:
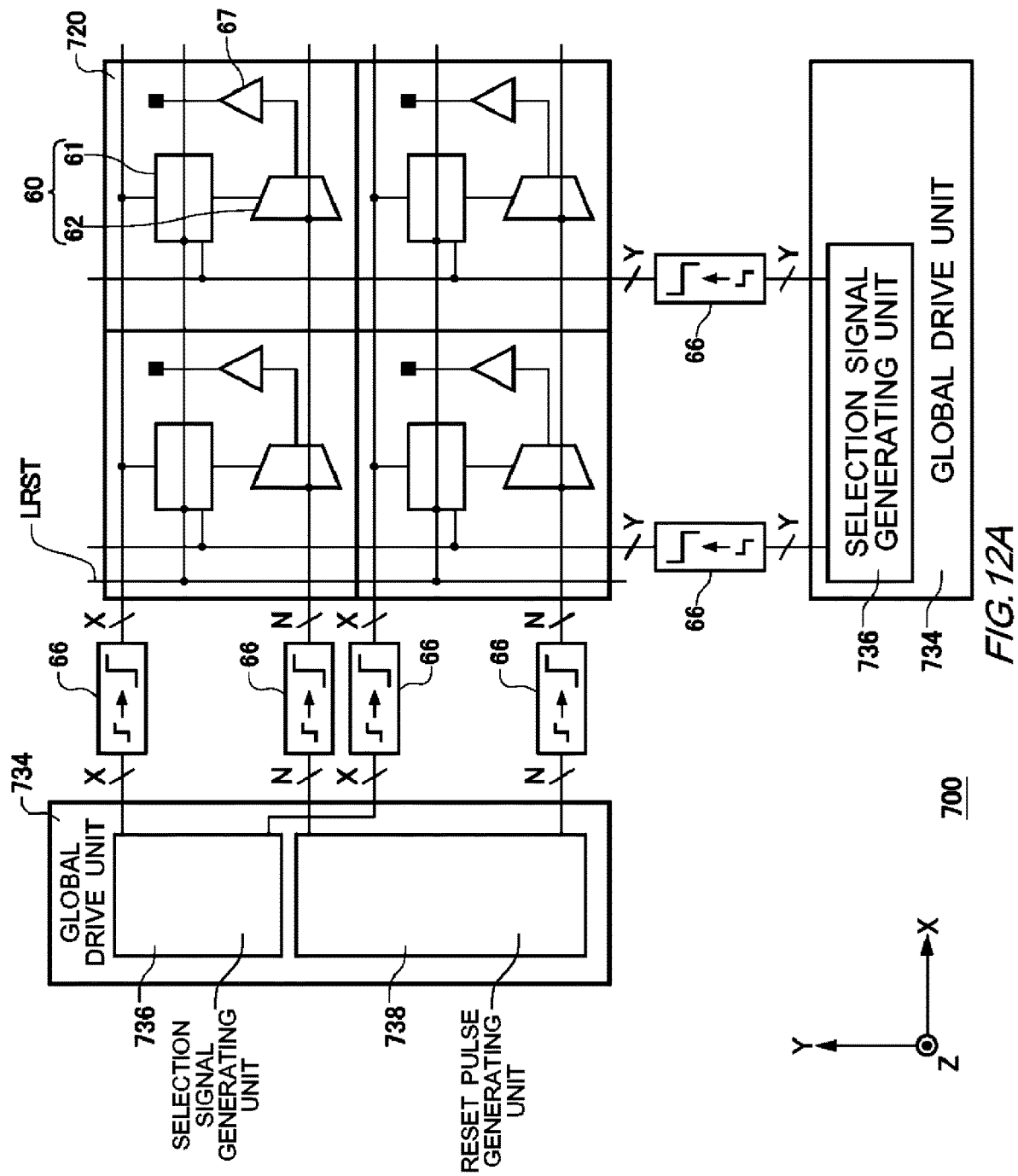
FIG. 12A shows an example of a configuration of a signal processing chip 700 according to Comparative Example.

FIG. 12A shows an example of a configuration of the signal processing chip 700 according to Comparative Example. The global drive unit 734 has a selection signal generating unit 736 and a reset pulse generating unit 738. The signal processing chip 700 of the present example has the level shifters 66 arranged at the periphery of the control blocks 720. The level shifter 66 is configured to input an analog signal to the control block 720. Therefore, the control block 720 needs to configure the logic circuit 60 with an analog transistor. Therefore, a circuit area of the control block 720 is increased.

Figure 12B:
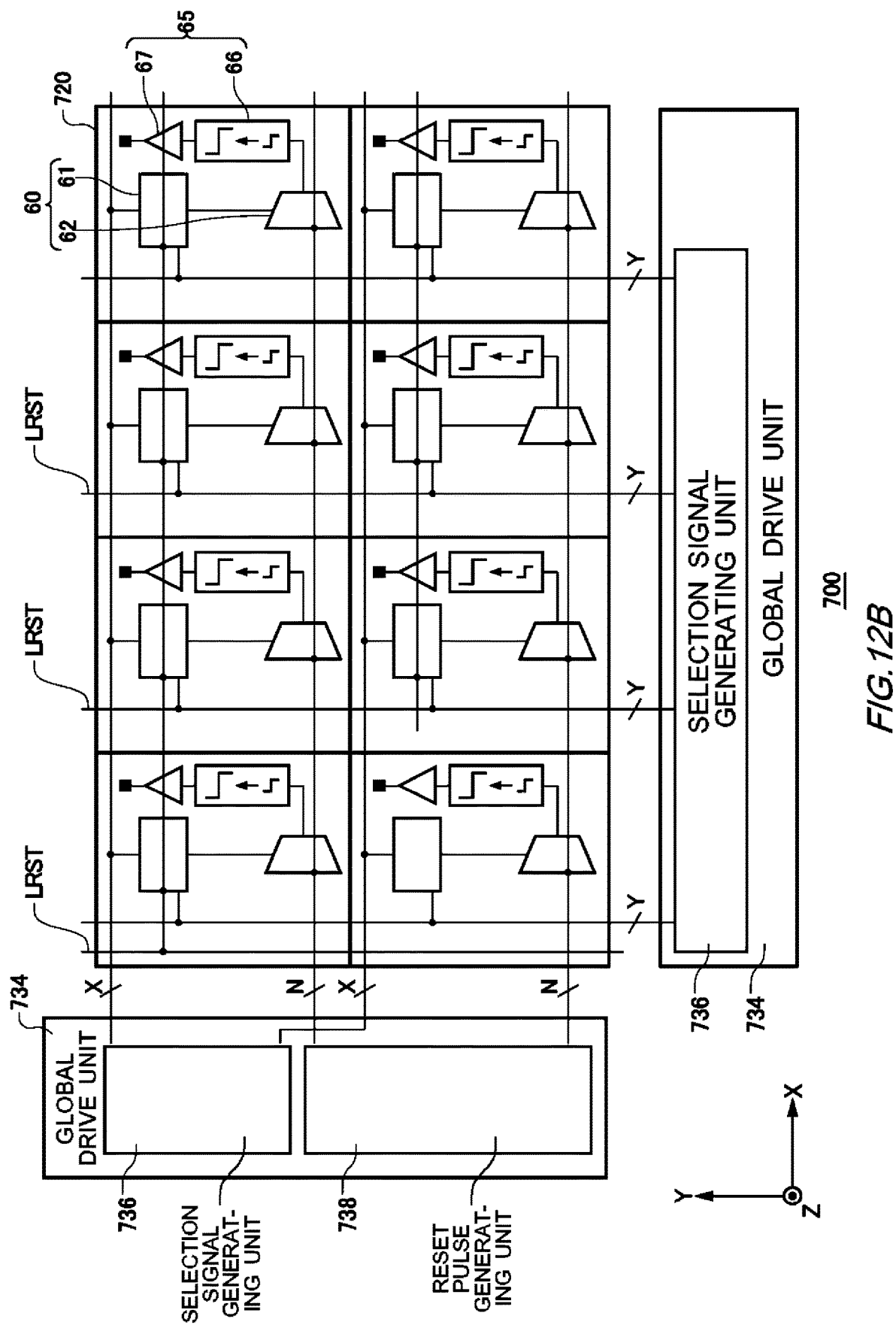
FIG. 12B shows another example of the signal processing chip 700 according to Comparative Example.

FIG. 12B shows another example of the signal processing chip 700 according to Comparative Example. In the signal processing chip 700 of the present example, the level shifters 66 are provided inside the control blocks 720, but the control blocks 720 are not reversedly arranged. For this reason, the logic circuits 60 or the analog circuits 65 cannot be collectively arranged in the adjacent control blocks 720.

Figure 12C:
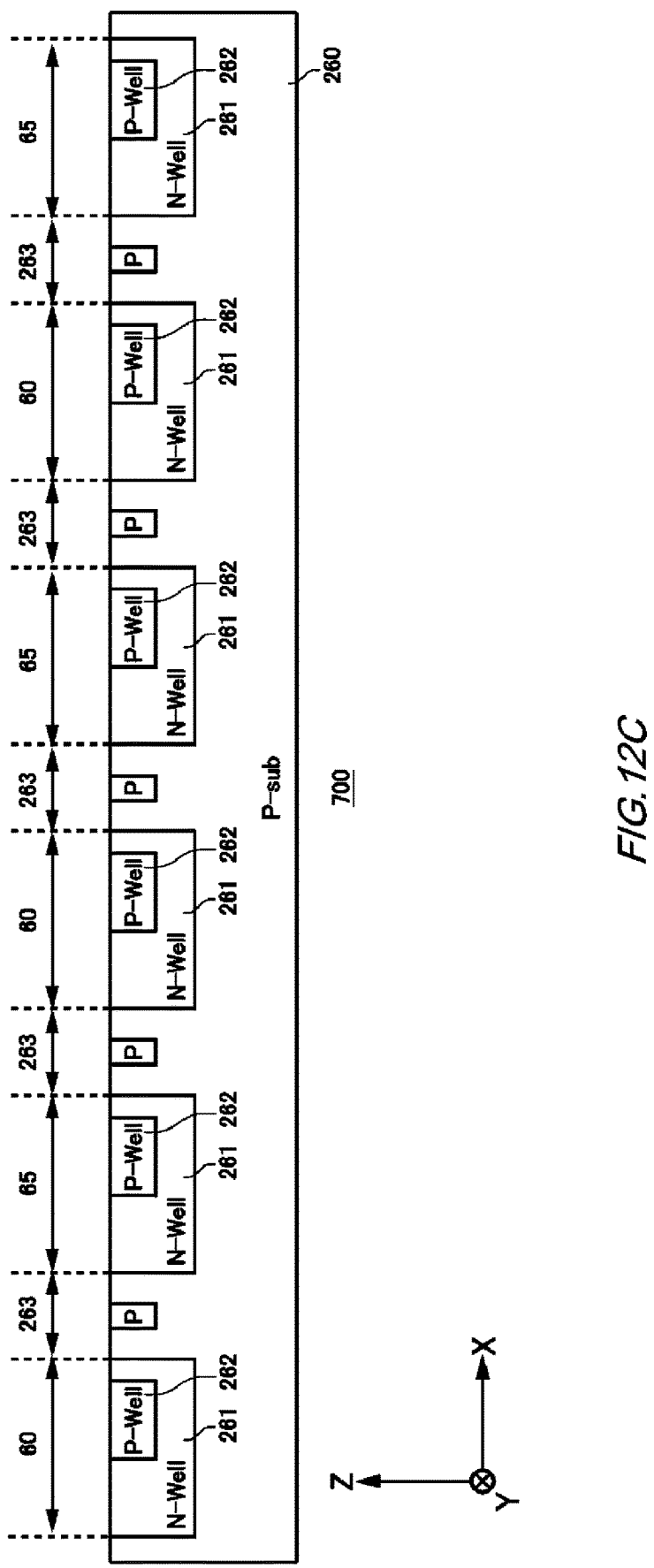
FIG. 12C shows an example of a cross-sectional view of the signal processing chip 700 according to Comparative Example.

FIG. 12C shows an example of a cross-sectional view of the signal processing chip 700 according to Comparative Example. The present example shows a comparative example in which substantially the same numbers of the logic circuits 60 and analog circuits 65 as those in FIG. 11B are provided. However, in the signal processing chip 700 of the present example, the logic circuit 60 or the analog circuit 65 is not arranged in the adjacent control block 720. Therefore, the number of the well isolation regions 263 required is increased. For example, when the two well isolation regions 263 need to be provided in the case of FIG. 11B, the five well isolation regions 263 are required in FIG. 12C. As the number of the well isolation regions 263 provided increases, the circuit area increases.

Figure 13:
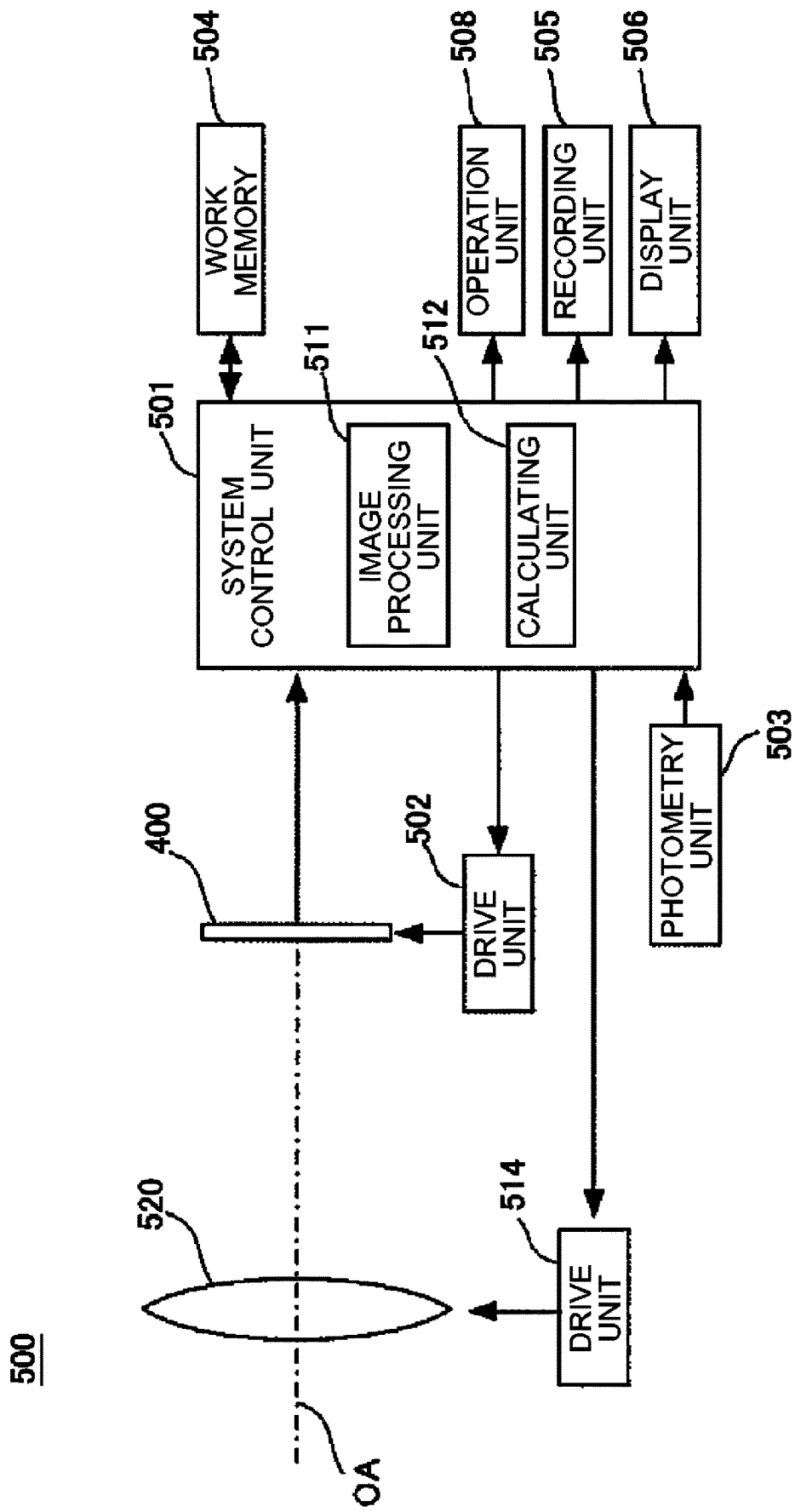
FIG. 13 is a block diagram showing a configuration example of an image capturing apparatus 500 according to an embodiment.

FIG. 13 is a block diagram showing a configuration example of an image capturing apparatus 500 according to an embodiment. The image capturing apparatus 500 includes the image capturing device 400, a system control unit 501, a drive unit 502, a photometry unit 503, a work memory 504, a recording unit 505, a display unit 506, a drive unit 514, and a photographing lens 520.

The photographing lens 520 is configured to guide a photographic subject-emanating light flux incident along an optical axis OA to the image capturing device 400. The photographing lens 520 includes a plurality of optical lens groups, and is configured to form an image of the photographic subject-emanating light flux from a scene, in the vicinity of a focal plane of the photographing lens. The photographing lens 520 may be a replaceable lens that can be attached and detached with respect to the image capturing apparatus 500. Note that, in FIG. 13, the photographing lens 520 is represented by one virtual lens arranged near the pupil.

The drive unit 514 is configured to drive the photographing lens 520. In an example, the drive unit 514 is configured to move the optical lens group of the photographing lens 520 to change a focusing position. In addition, the drive unit 514 may be configured to drive an iris diaphragm in the photographing lens 520 to control a light amount of the photographic subject-emanating light flux incident on the image capturing device 400.

The drive unit 502 has a control circuit configured to execute electric charge accumulating control such as timing control and area control of the image capturing device 400 according to instructions from the system control unit 501. In addition, the operation unit 508 is configured to receive an instruction from a photographer using a release button or the like.

The image capturing device 400 is configured to transfer pixel signals to an image processing unit 511 of the system control unit 501. The image processing unit 511 is configured to generate image data by performing various image processing using the work memory 504 as a work space. For example, when generating image data of a JPEG file format, compression processing is executed after generating a color video signal from a signal obtained with the Bayer array. The generated image data is recorded in the recording unit 505, converted into a display signal, and displayed on the display unit 506 for a preset time.

The photometry unit 503 is configured to detect a luminance distribution of a scene prior to a series of photographing sequences for generating image data. The photometry unit 503 includes, for example, an AE sensor with approximately one million pixels. A calculating unit 512 of the system control unit 501 is configured to receive an output of the photometry unit 503 and to calculate a luminance for each area of the scene.

The calculating unit 512 is configured to determine a shutter speed, an aperture value, and an ISO sensitivity according to the calculated luminance distribution. The photometry unit 503 may also be used by the image capturing device 400. Note that, the calculating unit 512 is also configured to execute various calculations for operating the image capturing apparatus 500. The drive unit 502 may be partially or entirely mounted on the image capturing device 400. A part of the system control unit 501 may be mounted on the image capturing device 400.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order. The invention described in the present specification can also be implemented by forms described in following items.

[Item 1] An image capturing device comprising:
    a pixel unit having a plurality of pixels,
    a comparator configured to convert an analog signal output by the pixel unit into a digital signal, and
    a storage unit configured to store the digital signal, wherein
    the comparator corresponding to a first pixel block among the plurality of pixels is reversedly arranged with respect to the comparator corresponding to a second pixel block adjacent to the first pixel block.

[Item 2] The image capturing device according to Item 1, wherein
    the storage unit corresponding to the first pixel block is reversedly arranged with respect to the storage unit corresponding to the second pixel block.

[Item 3] The image capturing device according to Item 1 or 2, comprising:
    a pixel chip having the pixel unit, and
    a signal processing chip stacked with the pixel chip and configured to process a pixel signal from the pixel unit, wherein
    the signal processing chip includes a plurality of control blocks each provided corresponding to a pixel block of the plurality of pixels.

[Item 4] The image capturing device according to Item 3, wherein
    the comparator of a first control block among the plurality of control blocks is reversedly arranged with respect to the comparator of a second control block adjacent to the first control block, in a predetermined first direction.

[Item 5] The image capturing device according to Item 4, wherein
    the comparator of the first control block is reversedly arranged with respect to the comparator of a third control block adjacent to the first pixel block in a second direction orthogonal to the first direction.

[Item 6] The image capturing device according to any one of Items 3 to 5, wherein
    the plurality of control blocks each have a level shift unit configured to convert a voltage level, and the level shift units of the adjacent control blocks among the plurality of control blocks are provided in the same well region.

[Item 7] The image capturing device according to any one of Items 3 to 6, wherein
the plurality of control blocks each have a joining unit extending in a predetermined extension direction and provided for connecting to the pixel chip, and
the storage units and the joining units are reversedly arranged in the plurality of control blocks adjacent in a direction different from the extension direction.

[Item 8] The image capturing device according to any one of Items 3 to 7, wherein
the plurality of control blocks each have a signal output unit for outputting the digital signal output by the comparator in a predetermined output direction, and
the comparators and the signal output units are reversedly arranged in the plurality of control blocks adjacent in a direction different from the output direction.

[Item 9] The image capturing device according to any one of Items 3 to 8, comprising a control wiring provided extending in a predetermined wiring direction, wherein
the control wiring is provided shared in the plurality of control blocks adjacent in a direction different from the wiring direction.

[Item 10] An image capturing apparatus comprising the image capturing device according to any one of Items 1 to 9.

[Item 11] An image capturing device comprising:
a pixel unit having a plurality of pixels,
a signal converting unit configured to convert an analog signal output by the pixel unit into a digital signal,
an exposure control unit configured to control exposure of the plurality of pixels, and
a pixel drive unit configured to drive the plurality of pixels, wherein
the pixel drive unit extends in a predetermined first direction and the exposure control unit extends in a second direction different from the first direction, so that the pixel drive unit and the exposure control unit are arranged in an L-shape.

[Item 12] The image capturing device according to Item 11, comprising:
a pixel chip having the pixel unit, and
a signal processing chip stacked with the pixel chip and having the signal converting unit, wherein
the signal processing chip includes control blocks each provided corresponding to a pixel block of the plurality of pixels.

[Item 13] The image capturing device according to Item 12, wherein
the pixel drive unit and the exposure control unit having the L-shape constitute an outer periphery of the control block.

[Item 14] The image capturing device according to Item 12 or 13, wherein
the exposure control unit includes
a local control unit provided extending in the second direction, and
a level shift unit extending in the second direction and provided on an outer periphery side of the control block with respect to the local control unit.

[Item 15] The image capturing device according to Item 14, wherein
the level shift units of the adjacent control blocks are provided in the same well region.

[Item 16] The image capturing device according to any one of Items 12 to 15, comprising
a signal output unit provided between the signal converting unit and the exposure control unit and configured to output the digital-converted signal.

[Item 17] The image capturing device according to any one of Items 12 to 16, wherein
the signal processing chip includes
a first control block, and
a second control block provided adjacent to the first control block,
the signal converting unit includes a comparator configured to convert the analog signal into a digital signal, and
the comparator of the first control block is reversedly arranged with respect to the comparator of the second control block.

[Item 18] The image capturing device according to Item 17, wherein
the comparator of the first control block is reversedly arranged with respect to the comparator of a third control block adjacent to the first control block in a second direction orthogonal to the first direction.

[Item 19] The image capturing device according to Item 17 or 18, wherein
the signal converting unit includes a storage unit configured to store the digital signal output by the comparator, and
the storage unit of the first control block is reversedly arranged with respect to the storage unit of the second control block.

[Item 20] An image capturing apparatus comprising the image capturing device according to any one of Items 11 to 19.

EXPLANATION OF REFERENCES

10: exposure control unit, 12: local control unit, 14: level shift unit, 20: pixel drive unit, 30: joining unit, 40: signal converting unit, 42: comparator, 44: storage unit, 50: signal output unit, 60: logic circuit, 61: latch, 62: selector, 65: analog circuit, 66: level shifter, 67: buffer, 100: pixel chip, 104: photoelectric converting unit, 110: pixel unit, 112: pixel, 115: pixel group, 120: pixel block, 121: load current source, 122: signal line, 123: first transfer unit, 124: second transfer unit, 125: accumulating unit, 126: reset unit, 127: pixel output unit, 128: amplifying unit, 129: selecting unit, 132: connection region, 141: local control line, 142: local control line, 143: global control line, 150: joining surface, 152: bump, 154: dummy bump, 156: wiring, 200: signal processing chip, 210: main circuit unit, 220: control block, 230: peripheral circuit unit, 232: connection region, 234: global drive unit, 236: selection signal generating unit, 238: reset pulse generating unit, 240: control wiring, 260: semiconductor substrate, 261: first well region, 262: second well region, 263: well isolation region, 400: image capturing device, 500: image capturing apparatus, 501: system control unit, 502: drive unit, 503: photometry unit, 504: work memory, 505: recording unit, 506: display unit, 508: operation unit, 511: image processing unit, 512: calculating unit, 514: drive unit, 520: photographing lens, 600: pixel chip, 610: pixel unit, 620: pixel block, 632: connection region, 700: signal processing chip, 710: main circuit unit, 720: control block, 732: connection region, 734: global drive unit, 736: selection signal generating unit, 738: reset pulse generating unit, 740: control wiring, 800: image capturing device

What is claimed is:

1. An image capturing device comprising:
a first semiconductor substrate including
   a first pixel block including a first photoelectric converting unit configured to convert light into electric charges; and
   a second pixel block containing a second photoelectric converting unit configured to convert light into electric charges; and
a second semiconductor substrate stacked with the first semiconductor substrate, the second semiconductor substrate including
   a first control block including a first circuit unit, in which a first transistor for processing an analog signal is provided, and a second circuit unit, in which a second transistor for processing a digital signal is provided, and being configured to control an accumulation time of the electric charges converted by the first photoelectric converting unit; and
   a second control block (i) arranged next to the first control block, (ii) including a third circuit unit, in which a third transistor for processing an analog signal is provided, and a fourth circuit unit, in which a fourth transistor for processing a digital signal is provided, and (iii) being configured to control an accumulation time of the electric charges converted by the second photoelectric converting unit,
wherein the first circuit unit and the third circuit unit are formed in a well region provided in the second semiconductor substrate.

2. The image capturing device according to claim 1, wherein
the second semiconductor substrate includes
   a first well region with a first conductivity-type; and
   a plurality of second well regions, each with a second conductivity-type, and being provided in the first well region; and
the first circuit unit and the third circuit unit are formed in one of the plurality of second well regions.

3. The image capturing device according to claim 2, wherein
the second circuit unit is formed in one of the plurality of second well regions that is different from the second well region in which the first circuit unit and the third circuit unit are provided; and
the fourth circuit unit is formed in one of the plurality of second well regions that is different from the second well region in which the first circuit unit and the third circuit unit are provided.

4. The image capturing device according to claim 3, wherein
the first control block includes a first converting unit configured to convert an analog signal into a digital signal;
the second control block includes a second converting unit configured to convert an analog signal into a digital signal;
the first converting unit is formed in one of the plurality of second well regions that is different from the second well region in which the first circuit unit and the third circuit unit are provided; and
the second converting unit is formed in one of the plurality of second well regions that is different from the second well region in which the first circuit unit and the third circuit unit are provided.

5. The image capturing device according to claim 2, wherein
the first control block includes a first converting unit configured to convert an analog signal into a digital signal;
the second control block includes a second converting unit configured to convert an analog signal into a digital signal;
the first converting unit is formed in one of the plurality of second well regions that is different from the second well region in which the first circuit unit and the third circuit unit are provided; and
the second converting unit is formed in one of the plurality of second well regions that is different from the second well region in which the first circuit unit and the third circuit unit are provided.

6. The image capturing device according to claim 1, wherein
the first transistor is driven by a first power supply, and
the second transistor is driven by a second power supply that is different from the first power supply.

7. The image capturing device according to claim 6, wherein
the third transistor is driven by the first power supply, and
the fourth transistor is driven by the second power supply.

8. The image capturing device according to claim 6, wherein
the first circuit unit is arranged to form an outer periphery of the first control block, and
the third circuit unit is arranged to form an outer periphery of the second control block.

9. The image capturing device according to claim 8, wherein
the first circuit unit is arranged along two or more sides among a plurality of sides that form the outer periphery of the first control block; and
the second circuit unit is arranged along two or more sides among a plurality of sides that form the outer periphery of the second control block.

10. The image capturing device according to claim 9, wherein
the first circuit unit is arranged in an L-shape in the first control block, and
the third circuit unit is arranged in an L-shape in the second control block.

11. The image capturing device according to claim 6, wherein
the first circuit unit, the second circuit unit, the third circuit unit and the fourth circuit unit are arranged such that a distance between the first circuit unit and the third circuit unit is shorter than a distance between the second circuit unit and the fourth circuit unit.

12. The image capturing device according to claim 6, wherein
the first circuit unit and the third circuit unit are arranged between the second circuit unit and the fourth circuit unit.

13. The image capturing device according to claim 6, wherein
the third circuit unit and the fourth circuit unit in the second control block are reversely arranged at positions with respect to arrangement positions of the first circuit unit and the second circuit unit in the first control block.

14. The image capturing device according to claim 13, wherein
the second control block is arranged next to the first control block in a column direction; and
the third circuit unit and the fourth circuit unit in the second control block are arranged at positions reversed vertically with respect to the arrangement positions of the first circuit unit and the second circuit unit in the first control block.

15. The image capturing device according to claim 13, wherein
the second control block is arranged next to the first control block in a row direction; and
the third circuit unit and the fourth circuit unit in the second control block are arranged at positions reversed horizontally with respect to the arrangement positions of the first circuit unit and the second circuit unit in the first control block.

16. The image capturing device according to claim 1, wherein
the first circuit unit is arranged to form an outer periphery of the first control block, and
the third circuit unit is arranged to form an outer periphery of the second control block.

17. The image capturing device according to claim 16, wherein
the first circuit unit is arranged along two or more sides among a plurality of sides that form the outer periphery of the first control block; and
the second circuit unit is arranged along two or more sides among a plurality of sides that form the outer periphery of the second control block.

18. The image capturing device according to claim 17, wherein
the first circuit unit is arranged in an L-shape in the first control block, and
the third circuit unit is arranged in an L-shape in the second control block.

19. The image capturing device according to claim 1, wherein
the first circuit unit, the second circuit unit, the third circuit unit and the fourth circuit unit are arranged such that a distance between the first circuit unit and the third circuit unit is shorter than a distance between the second circuit unit and the fourth circuit unit.

20. The image capturing device according to claim 1, wherein
the first circuit unit and the third circuit unit are arranged between the second circuit unit and the fourth circuit unit.

21. The image capturing device according to claim 1, wherein
the third circuit unit and the fourth circuit unit in the second control block are reversely arranged at positions with respect to arrangement positions of the first circuit unit and the second circuit unit in the first control block.

22. The image capturing device according to claim 21, wherein
the second control block is arranged next to the first control block in a column direction; and
the third circuit unit and the fourth circuit unit in the second control block are arranged at positions reversed vertically with respect to the arrangement positions of the first circuit unit and the second circuit unit in the first control block.

23. The image capturing device according to claim 21, wherein
the second control block is arranged next to the first control block in a row direction; and
the third circuit unit and the fourth circuit unit in the second control block are arranged at positions reversed horizontally with respect to the arrangement positions of the first circuit unit and the second circuit unit in the first control block.

24. The image capturing device according to claim 1, wherein
the first circuit unit includes a first buffer circuit configured to output a control signal for controlling the accumulation time of the electric charges converted by the first photoelectric converting unit; and
the third circuit unit includes a second buffer circuit configured to output a control signal for controlling the accumulation time of the electric charges converted by the second photoelectric converting unit.

25. The image capturing device according to claim 24, wherein
the first pixel block includes a first transfer unit configured to transfer the electric charges converted by the first photoelectric converting unit;
the second pixel block includes a second transfer unit configured to transfer the electric charges converted by the second photoelectric converting unit;
the first buffer circuit is configured to output a first transfer control signal for controlling the first transfer unit; and
the second buffer circuit is configured to output a second transfer control signal for controlling the second transfer unit.

26. The image capturing device according to claim 25, wherein
the first buffer circuit is configured to output the first transfer control signal to a first transfer control line that is electrically connected to the first transfer unit; and
the second buffer circuit is configured to output the second transfer control signal to a second transfer control line that is electrically connected to the second transfer unit.

27. The image capturing device according to claim 26, wherein
the first pixel block includes a first discharge unit configured to discharge the electric charges converted by the first photoelectric converting unit;
the second pixel block includes a second discharge unit configured to discharge the electric charges converted by the second photoelectric converting unit;
the first buffer circuit is configured to output a first discharge control signal for controlling the first discharge unit; and
the second buffer circuit is configured to output a second discharge control signal for controlling the second discharge unit.

28. The image capturing device according to claim 27, wherein
the first buffer circuit is configured to output the first discharge control signal to a first discharge control line that is electrically connected to the first discharge unit; and
the second buffer circuit is configured to output the second discharge control signal to a second discharge control line that is electrically connected to the second discharge unit.

29. The image capturing device according to claim 25, wherein
the first pixel block includes:
a first accumulating unit to which the electric charges converted by the first photoelectric converting unit are transferred; and
a first reset unit configured to discharge the electric charges transferred to the first accumulating unit;

the second pixel block includes:
a second accumulating unit to which the electric charges converted by the second photoelectric converting unit are transferred; and
a second reset unit configured to discharge the electric charges transferred to the second accumulating unit, and
the second semiconductor substrate includes a drive unit configured to control the first reset unit and the second reset unit.

30. The image capturing device according to claim 29, wherein
the drive unit is configured to control the first control block and the second control block.

31. The image capturing device according to claim 25, wherein
the first control block is arranged at a position facing the first pixel block; and
the second control block is arranged at a position facing the second pixel block.

32. The image capturing device according to claim 24, wherein
the first pixel block includes a first discharge unit configured to discharge the electric charges converted by the first photoelectric converting unit;
the second pixel block includes a second discharge unit configured to discharge the electric charges converted by the second photoelectric converting unit;
the first buffer circuit is configured to output a first discharge control signal for controlling the first discharge unit; and
the second buffer circuit is configured to output a second discharge control signal for controlling the second discharge unit.

33. The image capturing device according to claim 32, wherein
the first buffer circuit is configured to output the first discharge control signal to a first discharge control line that is electrically connected to the first discharge unit; and
the second buffer circuit is configured to output the second discharge control signal to a second discharge control line that is electrically connected to the second discharge unit.

34. The image capturing device according to claim 32, wherein
the first pixel block includes:
a first accumulating unit to which the electric charges converted by the first photoelectric converting unit are transferred; and
a first reset unit configured to discharge the electric charges transferred to the first accumulating unit;
the second pixel block includes:
a second accumulating unit to which the electric charges converted by the second photoelectric converting unit are transferred; and
a second reset unit configured to discharge the electric charges transferred to the second accumulating unit, and
the second semiconductor substrate includes a drive unit configured to control the first reset unit and the second reset unit.

35. The image capturing device according to claim 34, wherein
the drive unit is configured to control the first control block and the second control block.

36. The image capturing device according to claim 32, wherein
the first control block is arranged at a position facing the first pixel block; and
the second control block is arranged at a position facing the second pixel block.

37. The image capturing device according to claim 1, wherein
the first pixel block includes:
a first accumulating unit to which the electric charges converted by the first photoelectric converting unit are transferred; and
a first reset unit configured to discharge the electric charges transferred to the first accumulating unit;
the second pixel block includes:
a second accumulating unit to which the electric charges converted by the second photoelectric converting unit are transferred; and
a second reset unit configured to discharge the electric charges transferred to the second accumulating unit, and
the second semiconductor substrate includes a drive unit configured to control the first reset unit and the second reset unit.

38. The image capturing device according to claim 37, wherein
the drive unit is configured to control the first control block and the second control block.

39. The image capturing device according to claim 37, wherein
the first control block is arranged at a position facing the first pixel block; and
the second control block is arranged at a position facing the second pixel block.

40. The image capturing device according to claim 1, wherein
the first control block is arranged at a position facing the first pixel block; and
the second control block is arranged at a position facing the second pixel block.

41. The image capturing device according to claim 1, wherein
the first pixel block includes a plurality of the first photoelectric converting units, and
the second pixel block includes a plurality of the second photoelectric converting units.

42. The image capturing device according to claim 41, wherein
the plurality of the first photoelectric converting units are arranged along a first direction; and
the plurality of the second photoelectric converting units are arranged along the first direction.

43. The image capturing device according to claim 42, wherein
the plurality of the first photoelectric converting units are arranged along a second direction which intersects the first direction; and
the plurality of the second photoelectric converting units are arranged along the second direction.

44. An image capturing apparatus comprising the image capturing device according to claim 1.

45. An image capturing apparatus comprising the image capturing device according to claim 2.

46. An image capturing apparatus comprising the image capturing device according to claim 6.

47. An image capturing apparatus comprising the image capturing device according to claim 16.

48. An image capturing apparatus comprising the image capturing device according to claim 19.

49. An image capturing apparatus comprising the image capturing device according to claim 20.

50. An image capturing apparatus comprising the image capturing device according to claim 21.

51. An image capturing apparatus comprising the image capturing device according to claim 24.

52. An image capturing apparatus comprising the image capturing device according to claim 37.

53. An image capturing apparatus comprising the image capturing device according to claim 40.

54. An image capturing apparatus comprising the image capturing device according to claim 41.

* * * * *